(12) United States Patent
Hu et al.

(10) Patent No.: US 12,328,963 B2
(45) Date of Patent: Jun. 10, 2025

(54) SEMICONDUCTOR DEVICE AND MANUFACTURING METHOD THEREFOR

(71) Applicant: WUHAN XINXIN SEMICONDUCTOR MANUFACTURING CO., LTD., Hubei (CN)

(72) Inventors: Sheng Hu, Hubei (CN); Fan Yang, Hubei (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 489 days.

(21) Appl. No.: 17/829,116

(22) Filed: May 31, 2022

(65) Prior Publication Data

US 2022/0293646 A1 Sep. 15, 2022

Related U.S. Application Data

(63) Continuation of application No. PCT/CN2020/126046, filed on Nov. 3, 2020.

(30) Foreign Application Priority Data

Dec. 2, 2019 (CN) .......................... 201911214643.5

(51) Int. Cl.
H01L 27/146 (2006.01)
H01L 21/762 (2006.01)
H10F 39/00 (2025.01)

(52) U.S. Cl.
CPC ..... *H10F 39/807* (2025.01); *H01L 21/76224* (2013.01); *H10F 39/011* (2025.01); *H10F 39/811* (2025.01)

(58) Field of Classification Search
CPC .......... H01L 27/1463; H01L 27/14636; H10F 39/807; H10F 39/811
See application file for complete search history.

(56) References Cited

U.S. PATENT DOCUMENTS

| 11,791,367 B2* | 10/2023 | Yang ................... H10F 39/8023 257/446 |
| 2002/0173130 A1* | 11/2002 | Pomerede .......... H01L 21/0262 438/286 |

(Continued)

FOREIGN PATENT DOCUMENTS

| CN | 103403869 A | 11/2013 |
| CN | 104637968 A | 5/2015 |

(Continued)

OTHER PUBLICATIONS

Machine translation, He, Chinese Pat. Pub. No. CN108511476A, translation date: Oct. 11, 2024, Espacenet, all pages. (Year: 2024).*

(Continued)

*Primary Examiner* — Victoria K. Hall
(74) *Attorney, Agent, or Firm* — MUNCY, GEISSLER, OLDS & LOWE, P.C.

(57) ABSTRACT

A semiconductor device and a method of manufacturing the semiconductor device are disclosed. The method of manufacturing the semiconductor device includes: forming a trench fill structure in a pixel region of a substrate, where a high-k dielectric layer is sandwiched between a side wall of a fill material in the trench fill structure and the substrate; forming a plug structure in a pad region of the substrate; covering a surface of the substrate in the pixel region and the pad region with a buffer dielectric layer; etching the buffer dielectric layer to form first opening exposing at least part of the substrate around a top side wall portion of the trench fill structure and/or at least a top portion of the trench fill (Continued)

structure; and forming a metal grid layer on the buffer dielectric layer in the pixel region.

18 Claims, 13 Drawing Sheets

(56) References Cited

U.S. PATENT DOCUMENTS

| | | |
|---|---|---|
| 2016/0204142 A1 | 7/2016 | Um et al. |
| 2017/0207270 A1 | 7/2017 | Chen et al. |
| 2020/0251510 A1* | 8/2020 | Ge .................. H10F 39/199 |
| 2021/0043593 A1* | 2/2021 | Huang ................ H01L 24/08 |
| 2021/0098392 A1* | 4/2021 | Wu ................ H01L 27/14687 |
| 2022/0310682 A1* | 9/2022 | Yang ............... H01L 27/14636 |
| 2023/0378232 A1* | 11/2023 | Yang ............... H01L 27/14605 |
| 2023/0378233 A1* | 11/2023 | Yang ............... H01L 27/14687 |

FOREIGN PATENT DOCUMENTS

| | | | |
|---|---|---|---|
| CN | 106486506 A | 3/2017 | |
| CN | 106531750 A | 3/2017 | |
| CN | 106601758 A | 4/2017 | |
| CN | 107155375 A | 9/2017 | |
| CN | 108511476 A * | 9/2018 | ......... H01L 27/1463 |
| CN | 110246855 A | 9/2019 | |
| CN | 110783358 A | 2/2020 | |
| CN | 111029352 A | 4/2020 | |
| CN | 111029353 A | 4/2020 | |
| CN | 111312654 A | 6/2020 | |
| KR | 20110071084 A | 6/2011 | |
| KR | 101259724 B1 | 4/2013 | |

OTHER PUBLICATIONS

International Searching Authority, Written Opinion of the International Searching Authority, International application No. PCT/CN2020/126046, Feb. 8, 2021, all pages. (Year: 2021).*

International Searching Authority, International Search Report, International application No. PCT/CN2020/126046, Feb. 8, 2021, all pages. (Year: 2021).*

* cited by examiner

SEMICONDUCTOR DEVICE AND MANUFACTURING METHOD THEREFOR

CROSS-REFERENCES TO RELATED APPLICATION

This application is a continuation of International Patent Application No. PCT/CN2020/126046, filed on Nov. 3, 2020, entitled "SEMICONDUCTOR DEVICE AND MANUFACTURING METHOD THEREFOR", and for which priority is claimed under 35 U.S.C. § 120; and this application claims priority of application No. 201911214643.5 filed in China on Dec. 2, 2019 under 35 U.S.C. § 119 the entire contents of all of which are incorporated herein by reference.

TECHNICAL FIELD

The present invention relates to the field of semiconductor integrated circuit fabrication and, in particular, to a semiconductor device and a method of manufacturing the device.

BACKGROUND

During the fabrication of a back-side illuminated CMOS image sensor (BSI-CIS), the combined use of deep trench isolation (DTI) and backside metal grid (BMG) techniques enables better BSI-CIS optical properties.

However, in existing BSI-CIS fabrication processes, due to the presence of a buffer dielectric layer between a metal grid formed in a pixel region and an underlying substrate and deep trench fill structure, the metal grid can be connected to the underlying substrate and deep trench fill structure only physically but not electrically, leading to impossible optimization or improvement of the BSI-CIS's electrical performance.

Therefore, there is urgent need to modify the metal grid fabrication on the pixel region to enable electrical connection between the metal grid and the underlying substrate and/or trench fill structure and thereby obtain a semiconductor device with optimized and improved electrical performance.

SUMMARY OF THE INVENTION

It is an aim of the present invention to provide a semiconductor device and a method of manufacturing the semiconductor device, in which a metal grid layer is electrically connected to an exposed part of a substrate and/or an exposed portion of a trench fill structure, thus resulting in optimized and improved electrical performance of the semiconductor device.

In pursuit of this aim, the present invention provides a method of manufacturing a semiconductor device, including:
  providing a substrate with a pixel region and a pad region;
  forming a trench fill structure in the pixel region of the substrate;
  forming a plug structure in the pad region of the substrate;
  forming a buffer dielectric layer over both the pixel region and the pad region of the substrate so that both the trench fill structure and the plug structure are embedded in the buffer dielectric layer;
  etching the buffer dielectric layer to form a first opening and a second opening, the first opening exposing at least part of the substrate around a top side wall portion of the trench fill structure and/or at least a top portion of the trench fill structure, the second opening exposing at least a top portion of the plug structure; and
  forming a metal grid layer on the buffer dielectric layer in the pixel region so that the metal grid layer fills the first opening and is electrically connected to the exposed part of the substrate and/or the exposed portion of the trench fill structure.

Optionally, the step of forming the trench and the trench fill structure in the pixel region of the substrate may include:
  covering a surface of the substrate in the pixel region and the pad region with a pad oxide layer;
  forming a first patterned photoresist layer on the pad oxide layer and, with the first patterned photoresist layer serving as a mask, etching through the pad oxide layer and at least a partial thickness of the substrate in the pixel region, thereby forming a trench in the pixel region of the substrate;
  removing the first patterned photoresist layer and the pad oxide layer;
  successively forming a first isolating oxide layer, a high-k dielectric layer and a second isolating oxide layer in the trench and on the surface of the substrate in the pixel region and the pad region;
  filling the fill material in the trench in such a manner that the fill material also covers the second isolating oxide layer outside the trench; and
  performing an etching or chemical mechanical polishing process to remove the fill material, the second isolating oxide layer, the high-k dielectric layer and the first isolating oxide layer above the surface of the substrate outside the trench, or to remove only the fill material above the surface of the substrate outside the trench, thereby forming the trench fill structure in the trench.

Optionally, the fill material may include a first conductive metal layer, and wherein the exposure of at least a top portion of the trench fill structure in the first opening comprises: exposure of the first conductive metal layer at a top side wall portion of the trench fill structure in the first opening that is so formed as to surround the top side wall portion of the trench fill structure; and/or exposure of part or the entirety of a top surface of the first conductive metal layer in the trench fill structure in the first opening that resides on a top surface of the trench fill structure.

Optionally, a metal interconnection may be formed in the pad region of the substrate, wherein the step of forming the plug structure in the pad region of the substrate includes:
  covering the substrate in the pixel region and the pad region with a first buffer dielectric layer so that the trench fill structure is embedded in the first buffer dielectric layer;
  forming a second patterned photoresist layer on the first buffer dielectric layer and, with the second patterned photoresist layer serving as a mask, etching the first buffer dielectric layer, or the first buffer dielectric layer, the second isolating oxide layer, the high-k dielectric layer and the first isolating oxide layer, thus forming a third opening exposing at least part of the substrate around a top side wall portion of the trench fill structure and/or at least a top portion of the trench fill structure in the pixel region, and a fourth opening exposing part of a top surface of the substrate is exposed in the pad region, the fourth opening overlying the metal interconnection, wherein the third opening is located at the same position as the first opening;
  forming a second buffer dielectric layer on the first buffer dielectric layer so that the second buffer dielectric layer fills up both the third and fourth openings;

forming a third patterned photoresist layer on the second buffer dielectric layer and, with the third patterned photoresist layer serving as a mask, etching through the second buffer dielectric layer and a partial thickness of the substrate in the fourth opening, thereby forming a through hole in the substrate in the pad region in which a top surface of the metal interconnection is exposed; and forming a third isolating oxide layer on a side wall of the through hole and filling a second conductive metal layer in the through hole, thereby forming the plug structure in the through hole, which is electrically connected at the bottom of the second conductive metal layer to the metal interconnection.

Optionally, the step of forming the first and second openings by etching the buffer dielectric layer may include:

forming a fourth patterned photoresist layer on the buffer dielectric layer and, with the fourth patterned photoresist layer serving as a mask, etching the buffer dielectric layer, thereby forming the first opening in the buffer dielectric layer in the pixel region and the second opening in the buffer dielectric layer in the pad region, the first opening exposing at least part of the substrate around a top side wall portion of the trench fill structure and/or at least a top portion of the trench fill structure, the second opening exposing at least a top portion of the plug structure; and removing the fourth patterned photoresist layer.

Optionally, the step of forming the metal grid layer on the buffer dielectric layer in the pixel region may include:

forming a third conductive metal layer, which covers the buffer dielectric layer and fills up the first opening;

forming a fifth patterned photoresist layer on the third conductive metal layer and, with the fifth patterned photoresist layer serving as a mask, etching the third conductive metal layer, thus forming the metal grid layer in the pixel region, which is electrically connected to the part of the substrate and/or the portion of the trench fill structure connection exposed in the first opening; and removing the fifth patterned photoresist layer.

Optionally, at the same time when the metal grid layer is formed on the buffer dielectric layer in the pixel region, a pad structure may be formed on the buffer dielectric layer in the pad region, the pad structure filling the second opening and being electrically connected to the exposed top portion of the plug structure.

The present invention also provides a semiconductor device, including:

a substrate with a pixel region and a pad region, the substrate comprising a trench formed in the pixel region;

a trench fill structure formed in the pixel region of the substrate;

a plug structure formed in the pad region of the substrate;

a buffer dielectric layer formed over a surface of the substrate in the pixel region and the pad region, the buffer dielectric layer having a first opening and a second opening, the first opening exposing at least part of the substrate around a top side wall portion of the trench fill structure and/or at least a top portion of the trench fill structure, the second opening exposing at least a top portion of the plug structure; and a metal grid layer formed on the buffer dielectric layer in the pixel region such as to fill the first opening and be electrically connected to the exposed part of the substrate and/or the exposed portion of the trench fill structure.

Optionally, in the semiconductor device, the buffer dielectric layer may include a first buffer dielectric layer, a second buffer dielectric layer and a third buffer dielectric layer.

Optionally, the trench fill structure may include a first isolating oxide layer, the high-k dielectric layer and a second isolating oxide layer, which are sequentially stacked over a surface of the trench in the substrate, and the fill material filled in the trench, the first isolating oxide layer, the high-k dielectric layer and the second isolating oxide layer being situated between the side wall of the fill material and the substrate.

Optionally, the fill material may include a first conductive metal layer, wherein the exposure of at least a top portion of the trench fill structure in the first opening includes: exposure of the first conductive metal layer at a top side wall portion of the trench fill structure in the first opening that is so formed as to surround the top side wall portion of the trench fill structure; and/or exposure of part or the entirety of a top surface of the first conductive metal layer in the trench fill structure in the first opening that resides on a top surface of the trench fill structure.

Optionally, a metal interconnection may be formed in the pad region of the substrate, wherein the plug structure includes: a third isolating oxide layer on a side wall of a through hole in which a top surface of the metal interconnection is partially exposed; and a second conductive metal layer, which fills up the through hole and is electrically connected at the bottom to the metal interconnection.

Optionally, a pad structure may be also formed on the buffer dielectric layer in the pad region so as to fill up the second opening and be electrically connected to the exposed top portion of the plug structure.

Optionally, the high-k dielectric layer may have a k value of greater than 7.

Embodiments of the present invention offer the following advantages over the prior art:

1. The method of the present invention includes: forming a trench fill structure in a pixel region of a substrate, wherein a high-k dielectric layer is sandwiched between a side wall of a fill material in the trench fill structure and the substrate; forming a plug structure in a pad region of the substrate; forming a buffer dielectric layer on the substrate in the pixel region and the pad region so that the trench fill structure and the plug structure are both embedded in the buffer dielectric layer; etching the buffer dielectric layer to form a first opening and a second opening, the first opening exposing at least part of the substrate around a top side wall portion of the trench fill structure and/or at least a top portion of the trench fill structure, the second opening exposing at least a top portion of the plug structure; and forming a metal grid layer on the buffer dielectric layer in the pixel region, which fills the first opening and is electrically connected to the exposed part of the substrate and/or the exposed portion of the trench fill structure, thus resulting in optimized and improved electrical performance of the semiconductor device. Further, the high-k dielectric layer sandwiched between the side wall of the fill material in the trench fill structure and the substrate additionally optimizes the performance of the semiconductor device.

2. The semiconductor device of the present invention includes: a trench fill structure formed in a pixel region of a substrate, the trench fill structure including a fill material filled in a trench in the substrate and a high-k dielectric layer sandwiched between a side wall of the fill material and the substrate; a plug structure formed in a pad region of the substrate; a buffer dielectric layer formed on a surface of the substrate in the pixel region and the pad region, the buffer dielectric layer having a first opening and a second opening, the first opening exposing at least part of the substrate around a top side wall portion of the trench fill structure and/or at least a top portion of the trench fill structure, the second opening exposing at least a top portion of the plug structure; and a metal grid layer formed on the buffer dielectric layer in the pixel region, which fills the first opening and is electrically connected to the exposed part of the substrate and/or the exposed portion of the trench fill structure, thus resulting in optimized and improved electrical performance of the semiconductor device. Further, the high-k dielectric layer sandwiched between the side wall of the fill material in the trench fill structure and the substrate additionally optimizes the performance of the semiconductor device.

Figure 1A:
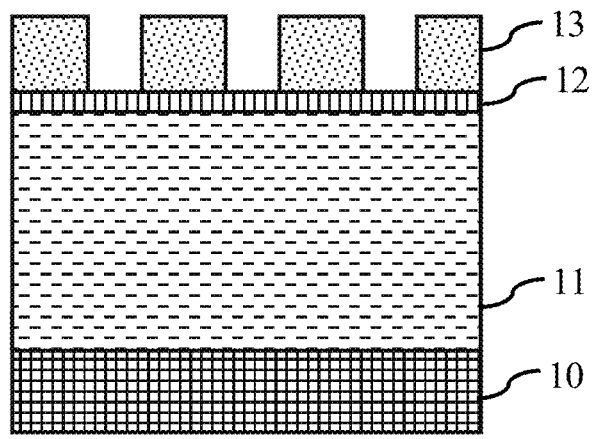
FIGS. 1a to 1f are schematic device illustrations of a device being fabricated in a semiconductor device fabrication process.

The following is a list of reference numerals used in FIGS. 1a to 7:

10—Substrate; 11—Pixel Region; 12—Pad Oxide Layer; 13—First Patterned Photoresist Layer; 14—Trench; 15—Trench Fill Structure; 151—Isolating Oxide Layer; 152—Conductive Metal Layer; 16—Buffer Oxide Layer; 17—Metal Grid Film; 18—Second Patterned Photoresist Layer; 19—Metal Grid Layer;

20—Substrate; 21—Pixel Region; 211—Trench; 212—Trench Fill Structure; 2121—First Isolating Oxide Layer; 2122—High-k Dielectric Layer; 2123—Second Isolating Oxide Layer; 2124—First Conductive Metal Layer; 213—Third Opening; 214—First Opening; 2151, 2152, 2153, 2154, 2155—Metal Grid Layer; 22—Pad Region; 221—Metal Interconnection; 222—Fourth Opening; 223—Through Hole; 224—Plug Structure; 2241—Third Isolating Oxide Layer; 2242—Second Conductive Metal Layer; 225—Second Opening; 226—Pad Structure; 23—Pad Oxide Layer; 24—First Patterned Photoresist Layer; 251—First Buffer Dielectric Layer; 252—Second Buffer Dielectric Layer; 253—Third Buffer Dielectric Layer; 26—Second Patterned Photoresist Layer; 27—Third Patterned Photoresist Layer; 28—Fourth Patterned Photoresist Layer; 29—Third Conductive Metal Layer; 30—Fifth Patterned Photoresist Layer.

DETAILED DESCRIPTION

A metal grid layer is made in a pixel region in the manner as detailed below.

As shown in FIG. 1a, a substrate 10 with the pixel region 11 is provided.

Figure 1B:
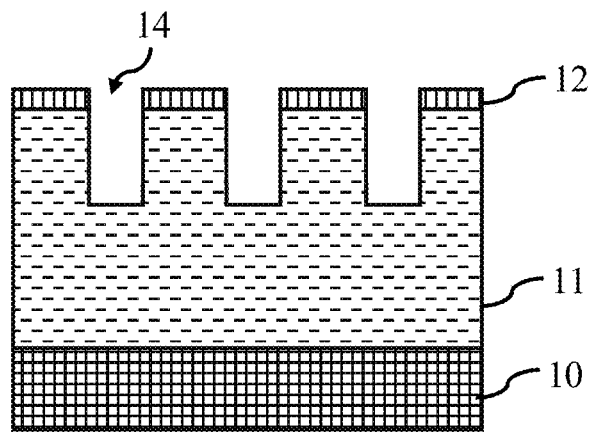

As shown in FIGS. 1a and 1b, a pad oxide layer 12 is formed over the pixel region 11, and a first patterned photoresist layer 13 on the pad oxide layer 12. With the first patterned photoresist layer 13 serving as a mask, an etching process is performed, which proceeds through the pad oxide layer 12 in the pixel region 11 and a fractional thickness of the substrate 10, forming a trench 14 in the pixel region 11 of the substrate 10. The first patterned photoresist layer 13 is then removed.

Figure 1C:
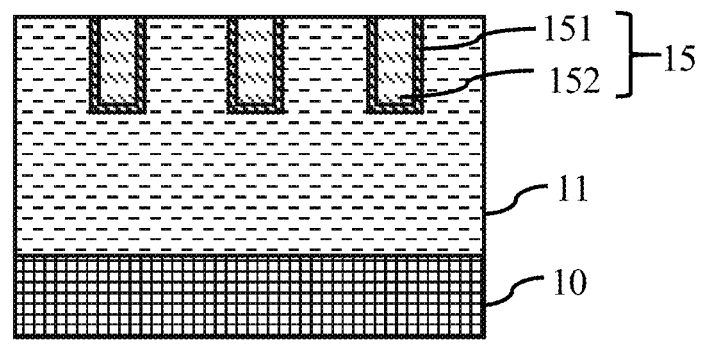

As shown in FIG. 1c, an isolating oxide layer 151 is formed over surfaces of the trench 14 and pad oxide layer 12, and a conductive metal layer 152 is filled in the trench 14 so as to also cover the pad oxide layer 12. A chemical mechanical polishing process may be employed to remove the conductive metal layer 152, the isolating oxide layer 151 and the pad oxide layer 12 above the substrate 10, resulting in the formation of a trench fill structure 15 in the trench 14. The trench fill structure 15 includes the isolating oxide layer 151 and the conductive metal layer 152.

Figure 1D:
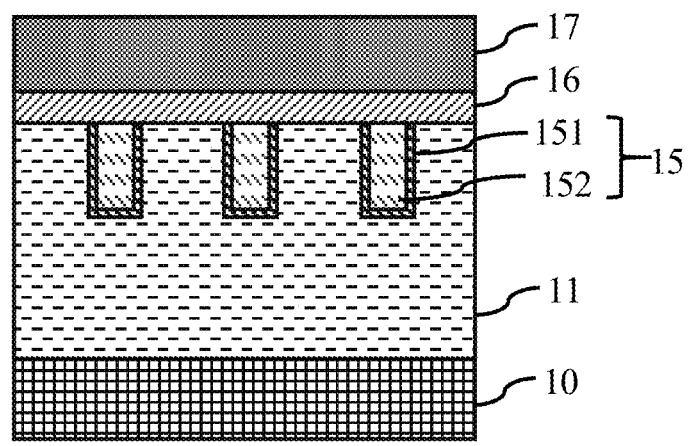

As shown in FIG. 1d, a buffer oxide layer 16 and a metal grid film 17 are successively formed over the substrate 10.

Figure 1E:
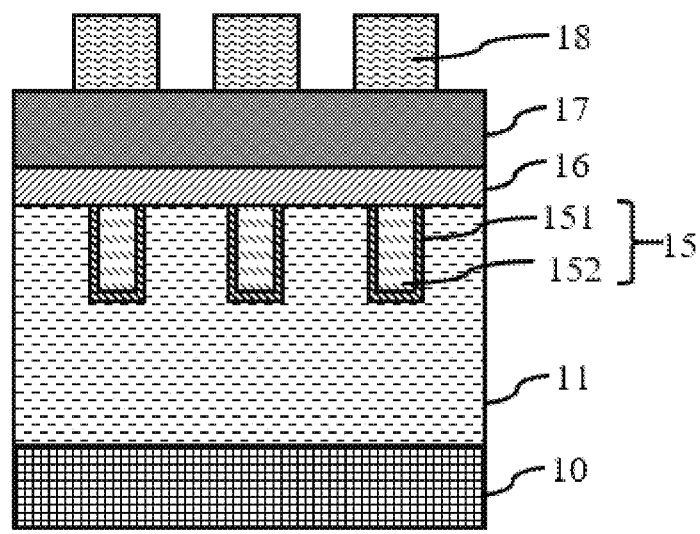
Figure 1F:
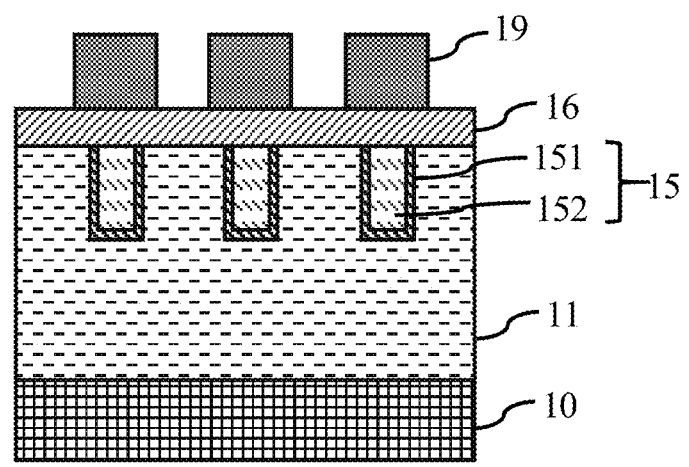

As shown in FIGS. 1e and 1f, a second patterned photoresist layer 18 is formed on the metal grid film 17. With the second patterned photoresist layer 18 serving as a mask, the metal grid film 17 is etched so that the metal grid layer 19 is formed on the buffer oxide layer 16. The second patterned photoresist layer 18 is then removed. The metal grid layer 19 is located above and aligned with the trench fill structure 15.

As apparent from the description of the above steps, due to the presence of the buffer oxide layer between the metal grid layer and the underlying substrate and trench fill structure, the metal grid layer in the pixel region can be connected to the underlying substrate and trench fill structure only physically but not electrically, making it impossible to optimize or improve electrical performance of the semiconductor device. In view of this, the present invention proposes a semiconductor device and a method of manufacturing it, in which electrical connection of the metal grid layer is enabled with the underlying substrate and trench fill structure, allowing the semiconductor device to have optimized and improved electrical performance.

In order that objects, advantages and features of the present invention become more apparent, the semiconductor device and method proposed in the invention will be described in greater detail below with reference to FIGS. 2 to 7. Note that the drawings are provided in a very simplified form not necessarily drawn to exact scale for the only purpose of helping to explain the disclosed embodiments in a more convenient and clearer way.

Figure 2:
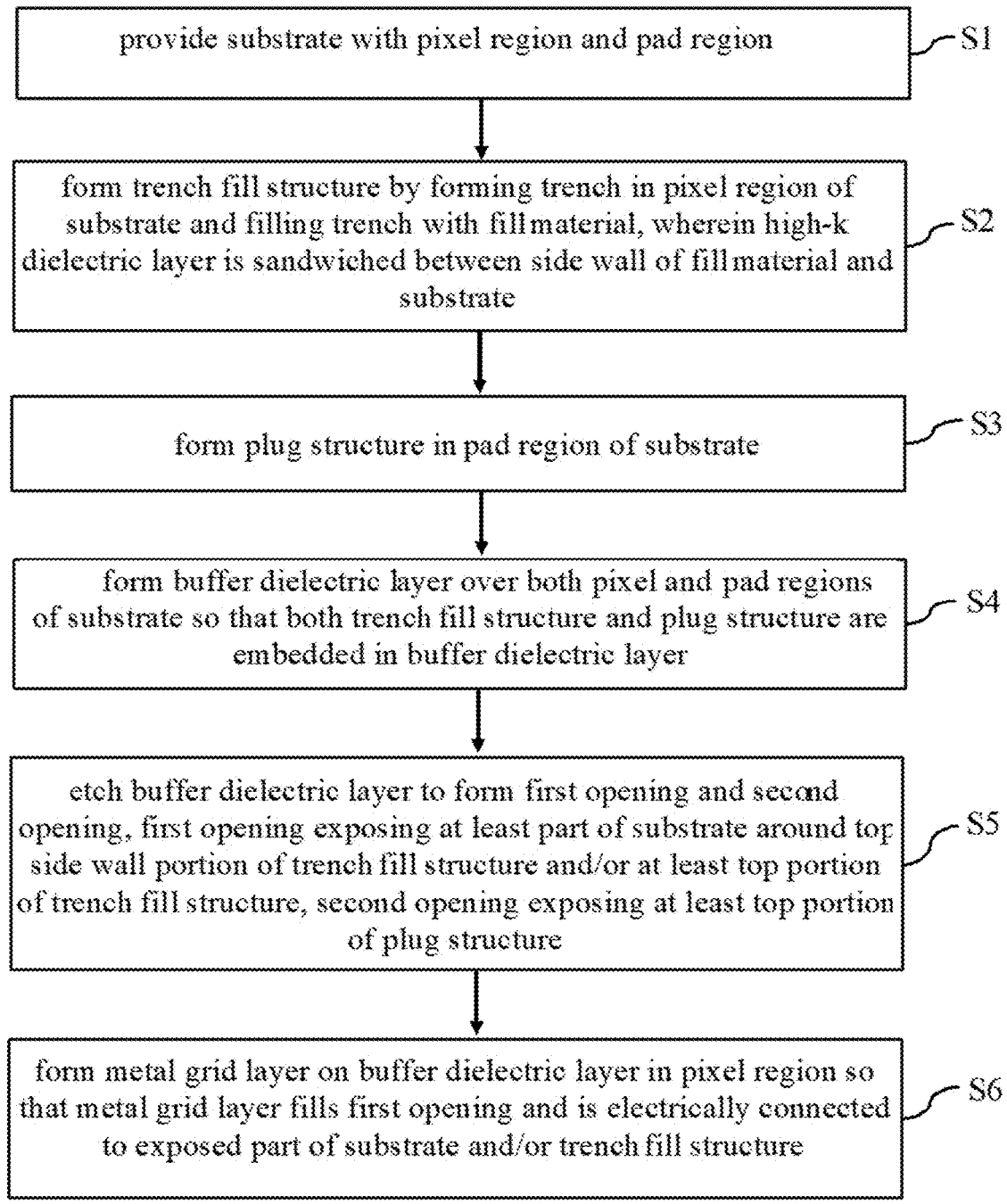
FIG. 2 is a flowchart of a method of manufacturing a semiconductor device according to an embodiment of the present invention.

In an embodiment of the present invention, there is provided a method of manufacturing a semiconductor device, which, as shown in FIG. 2, a flowchart thereof, includes the steps of:

Step S1, providing a substrate with a pixel region and a pad region;

Step S2, forming a trench in the pixel region of the substrate and filling the trench with a fill material, thus forming a trench fill structure, wherein a high-k dielectric layer is sandwiched between a side wall of the fill material and the substrate;

Step S3, forming a plug structure in the pad region of the substrate;

Step S4, forming a buffer dielectric layer over both the pixel and pad regions of the substrate so that both the trench fill structure and the plug structure are embedded in the buffer dielectric layer;

Step S5, etching the buffer dielectric layer to form a first opening and a second opening, the first opening exposing at least part of the substrate around a top side wall portion of the trench fill structure and/or at least a top portion of the trench fill structure, the second opening exposing at least a top portion of the plug structure;

Step S6, forming a metal grid layer on the buffer dielectric layer in the pixel region so that the metal grid layer fills the first opening and is electrically connected to the exposed part of the substrate and/or the exposed portion of the trench fill structure.

A more detailed description of the method of the present invention is set forth below with reference to FIGS. 3a to 7, which are all schematic longitudinal cross-sectional views of the semiconductor device being fabricated.

Figure 3A:
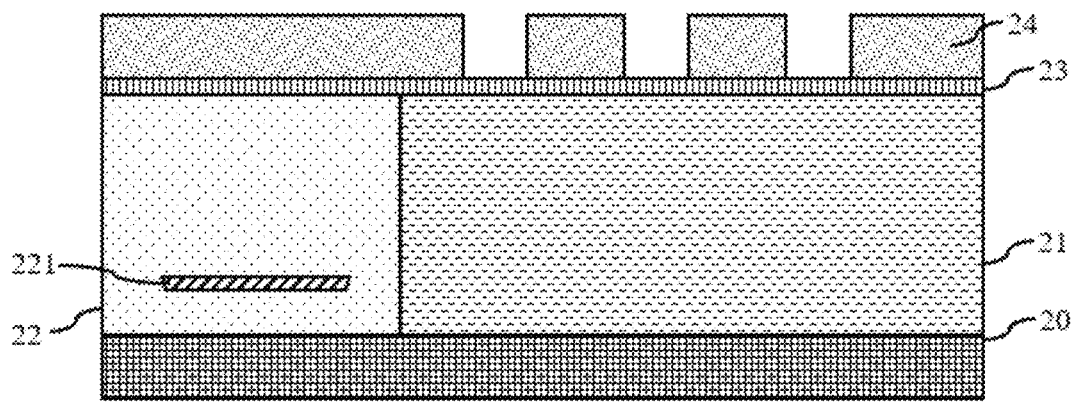
FIGS. 3a to 3p are schematic diagrams showing a device being fabricated in a first embodiment of the method of FIG. 2.

In step S1, a substrate 20 with a pixel region 21 and a pad region 22 is provided. The pad region 22 is peripheral to the pixel region 21, as shown in FIG. 3a. The substrate 20 may be any suitable material well known to those skilled in the art. For example, it may be at least one of silicon (Si), germanium (Ge), germanium silicon (SiGe), semiconductor on insulator (SOI), silicon carbide (SiC), germanium silicon carbide (SiGeC), indium arsenide (InAs), gallium arsenide (GaAs), indium phosphide (InP) or other III-V compound semiconductors.

A metal interconnection 221 is formed in the pad region 22 of the substrate 20. It is to be noted that other metal structures than the metal interconnection 221, such as a conductive contact plug, may also be formed in the pad region 22 of the substrate 20. These metal structures are exemplified below by the metal interconnection 221.

In step S2, a trench 211 is formed in the pixel region 21 of the substrate 20, and a fill material is filled in the trench 211, thus forming a trench fill structure 212. A high-k dielectric layer 2122 is sandwiched between a side wall of the fill material and the substrate 20.

The trench 211 may be a deep trench with a depth of 1-5 μm. It is to be noted that the depth of the trench 211 is not limited to being within the above range and may be appropriately determined according to performance requirements for the semiconductor device. The trench fill structure 212 may serve to isolate components in the pixel region 21 of the substrate 20. The high-k dielectric layer 2122 is preferred to have a k (dielectric permittivity) value of greater than 7. Materials from which the high-k dielectric layer 2122 can be made may include, but are not limited to, nitrides and metal oxides such as silicon nitride, silicon oxynitride, titanium dioxide, tantalum pentoxide, etc.

When the high-k dielectric layer 2122 is formed in the trench fill structure 212 in the pixel region 21, since it operates at a voltage in a different band and has different charge properties, it will change the charge in the substrate 20 and reduce a dark current that may produce noise harmful to the performance of the semiconductor device.

Figure 3B:
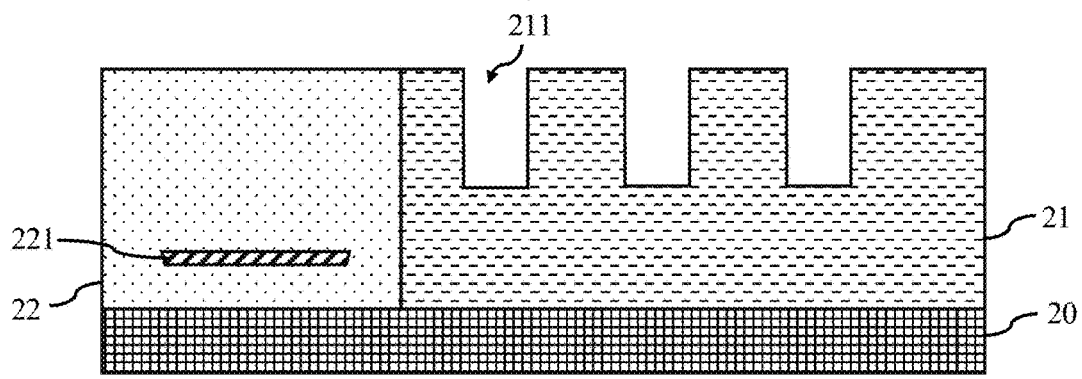
Figure 3C:
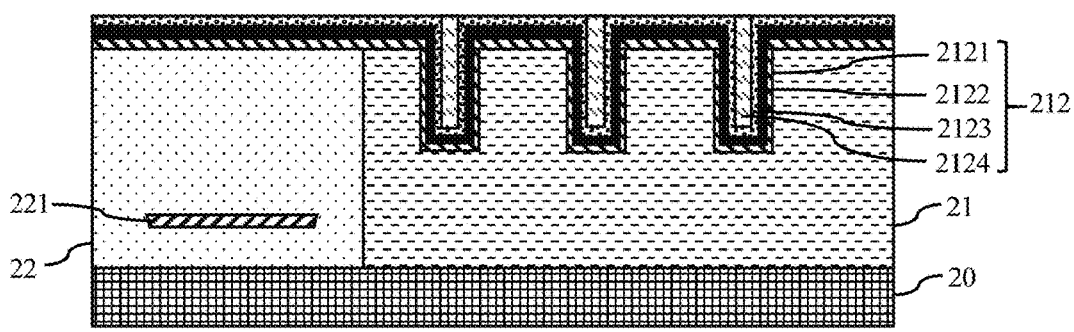
Figure 4A:
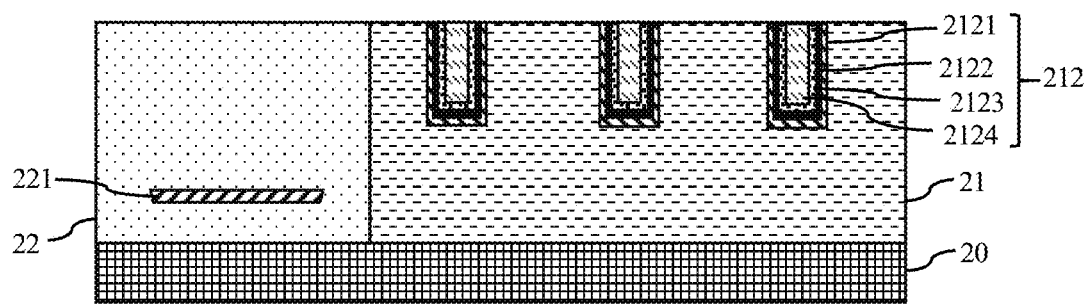
FIGS. 4a to 4n are schematic diagrams showing a device being fabricated in a second embodiment of the method of FIG. 2.

The step in which the trench 211 and the trench fill structure 212 are formed in the pixel region 21 of the substrate 20 includes: first, as shown in FIG. 3a, covering a surface of the substrate 20 in the pixel region 21 and the pad region 22 with a pad oxide layer 23, which is intended to protect the surface of the substrate 20 during the subsequent photolithographic formation of the first patterned photoresist layer 24; then, as shown in FIGS. 3a and 3b, forming the first patterned photoresist layer 24 on the pad oxide layer 23 and, with the first patterned photoresist layer 24 serving as a mask, etching through the pad oxide layer 23 and at least a partial thickness of the substrate 20 in the pixel region 21, thereby forming the trench 211 in the pixel region 21 of the substrate 20; subsequently, removing the first patterned photoresist layer 24 and the pad oxide layer 23; next, successively forming a first isolating oxide layer 2121, the high-k dielectric layer 2122 and a second isolating oxide layer 2123 in the trench 211 such that they also cover the surface of the substrate 20 in the pixel region 21 and the pad region 22, wherein the first isolating oxide layer 2121, the high-k dielectric layer 2122 and the second isolating oxide layer 2123 in the trench 211 may reside either only on a side wall of the trench 211 or on both the side wall and a bottom wall of the trench 211; afterwards, filling the fill material in the trench 211 so that it also covers the second isolating oxide layer 2123 surrounding the trench 211; and then performing an etching or chemical mechanical polishing process to remove the fill material, the second isolating oxide layer 2123, the high-k dielectric layer 2122 and the first isolating oxide layer 2121 above the surface of the substrate 20 around the trench 211 (as shown in FIG. 4a), or only the fill material above the surface of the substrate 20 around the trench 211 (as shown in FIG. 3c), thus forming the trench fill structure 212 in the trench 211. In FIG. 3c, the first isolating oxide layer 2121, the high-k dielectric layer 2122 and the second isolating oxide layer 2123 are shown as remaining over the substrate 20.

The fill material may include a dielectric material, or a metallic material, or both. When the fill material is a metallic material, as shown in FIGS. 3c and 4a, the trench fill structure 212 includes the first isolating oxide layer 2121, the high-k dielectric layer 2122 and the second isolating oxide layer 2123, all formed over the surface of the trench 211, and a first conductive metal layer 2124 that fills up the trench 211 (i.e., the fill material provides the first conductive metal layer 2124). The dielectric material may include at least one of silica, silicon nitride, ethyl silicate, borosilicate glass, phosphosilicate glass, boro-phospho-silicate glass and silicon oxynitride, and the metallic material may include at least one of tungsten, nickel, aluminum, silver, gold and titanium.

Additionally, a top surface of the trench fill structure 212 may be flush with the top surface of the substrate 20 (as shown in FIG. 4a). Alternatively, the top surface of the trench fill structure 212 may be higher than the top surface of the substrate 20 (as shown in FIG. 3c). Alternatively, only a top surface of the fill material in the trench fill structure 212 may be higher than the top surface of the substrate 20.

In step S3, a plug structure 224 is formed in the pad region 22 of the substrate 20. The step in which the plug structure 224 is formed in the pad region 22 of the substrate 20 may include the steps as follows.

Figure 3D:
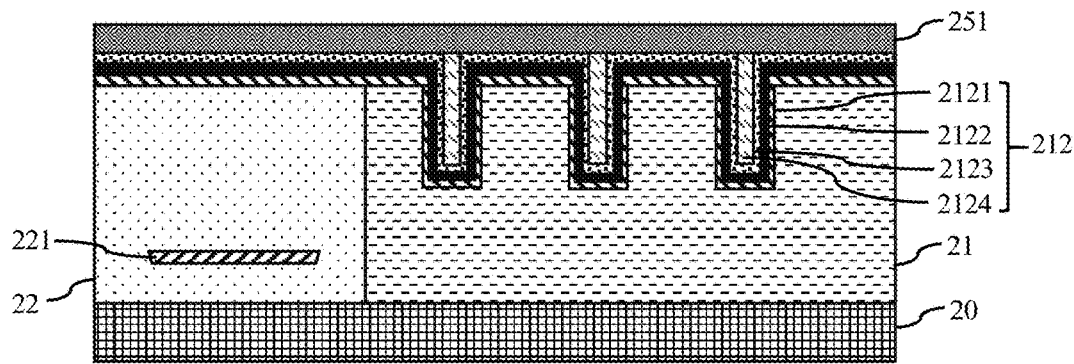
Figure 4B:
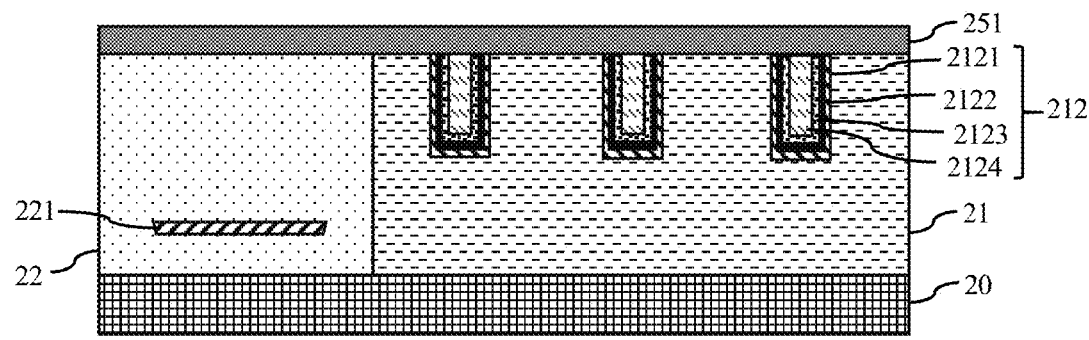

At first, as shown in FIGS. 3d and 4b, the substrate 20 in the pixel region 21 and the pad region 22 is covered with a first buffer dielectric layer 251 so that the trench fill structure 212 is embedded in the first buffer dielectric layer 251.

Figure 3E:
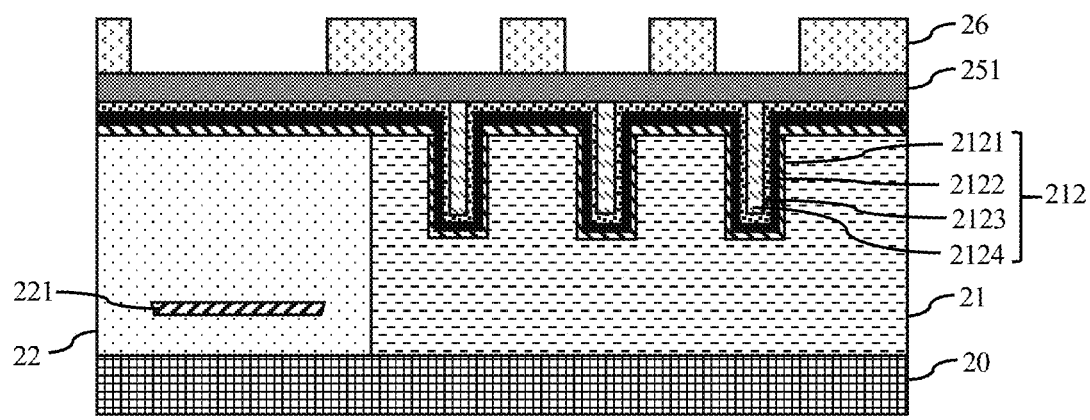
Figure 3F:
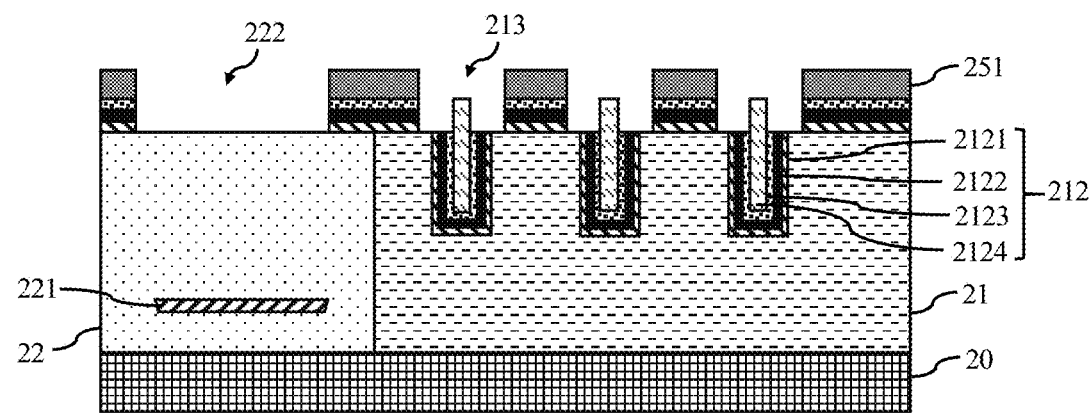
Figure 4C:
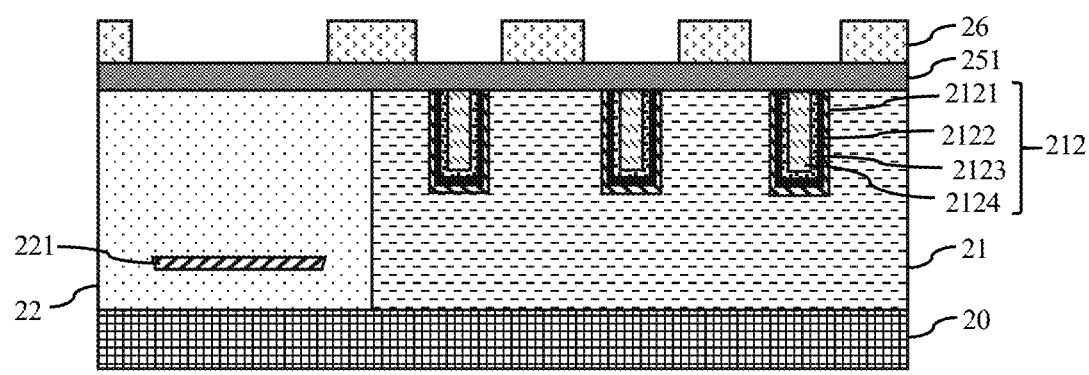
Figure 4D:
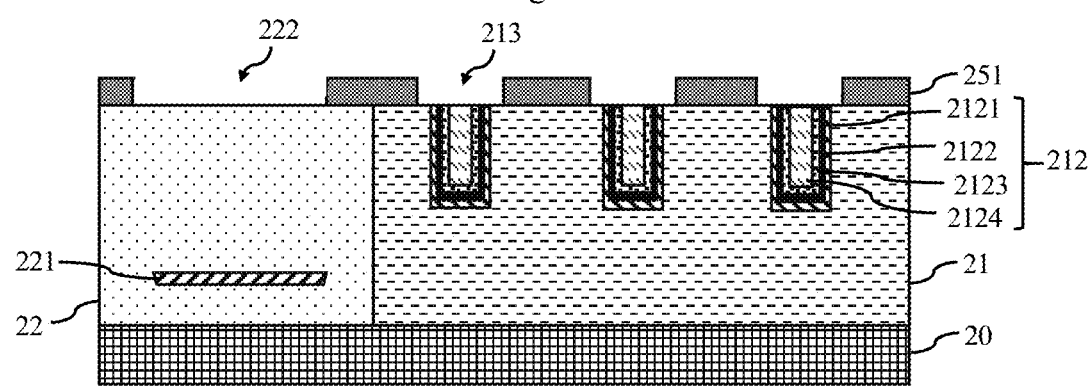

Subsequently, a second patterned photoresist layer 26 is formed on the first buffer dielectric layer 251 (as shown in FIGS. 3e and 4c), and with the second patterned photoresist layer 26 serving as a mask, the first buffer dielectric layer 251 is etched (as shown in FIG. 4d), or the first buffer dielectric layer 251, the second isolating oxide layer 2123, the high-k dielectric layer 2122 and the first isolating oxide layer 2121 are etched (as shown in FIG. 3f) to form a third opening 213 in the pixel region 21, in which at least part of the substrate 20 around a top side wall portion of the trench fill structure 212 and/or at least a top portion of the trench fill structure 212 is/are exposed, and a fourth opening 222 in the pad region 22, in which part of the top surface of the substrate 20 is exposed. The fourth opening 222 is formed above the metal interconnection 221. As shown in FIG. 3f, in the third opening 213, part of the substrate 20 around a top side wall portion of the trench fill structure 212 and the entire top surface of the trench fill structure 212 are exposed. Moreover, since a top surface of the first conductive metal layer 2124 is higher than the top surface of the substrate 20, the top side wall portion of the first conductive metal layer 2124 is also exposed in the third opening 213. As shown in FIG. 4d, the top surface of the trench fill structure 212 is flush with the top surface of the substrate 20, and therefore, part of the substrate 20 around a top side wall portion of the trench fill structure 212 and the entire top surface of the trench fill structure 212 are exposed in the third opening 213.

Figure 3G:
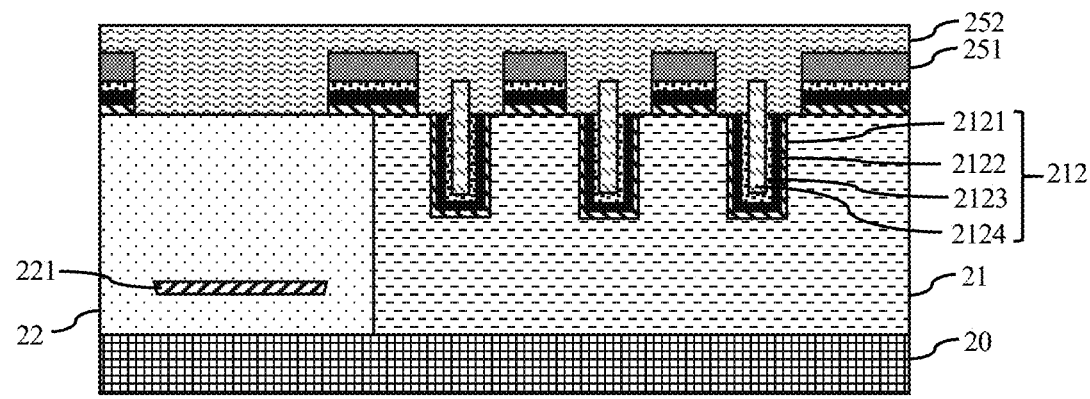
Figure 4E:
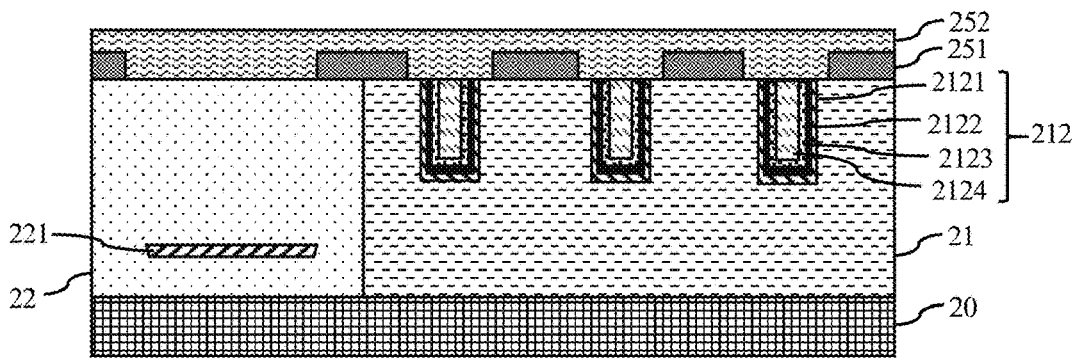

Next, as shown in FIGS. 3g and 4e, a second buffer dielectric layer 252 is formed so as to cover the first buffer dielectric layer 251 and fill up the third opening 213 and the fourth opening 222.

Figure 3H:
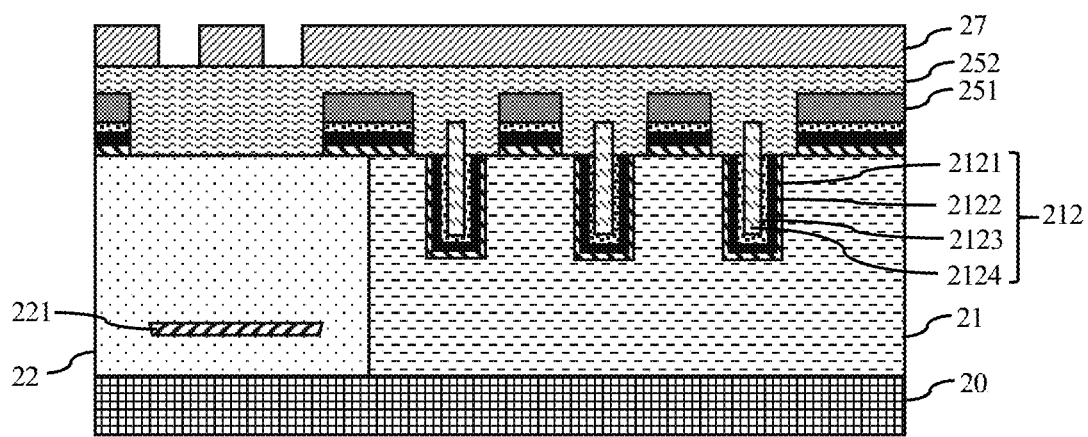
Figure 3I:
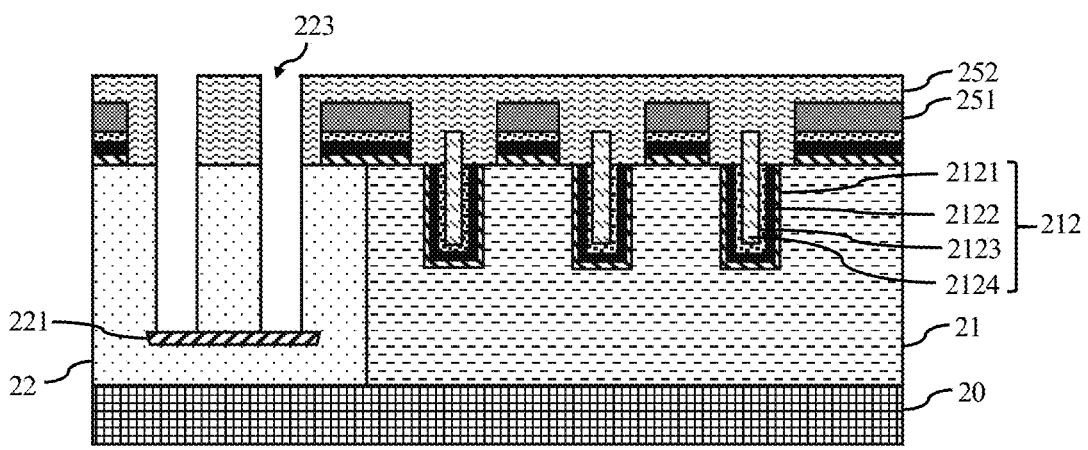
Figure 4F:
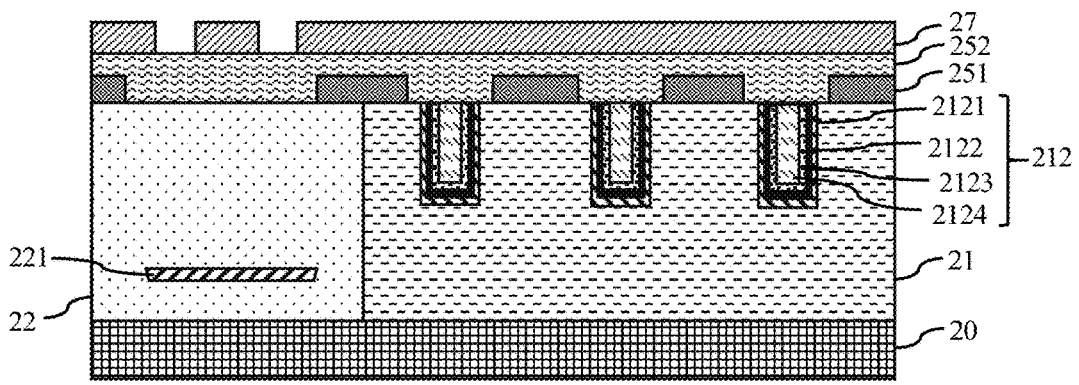
Figure 4G:
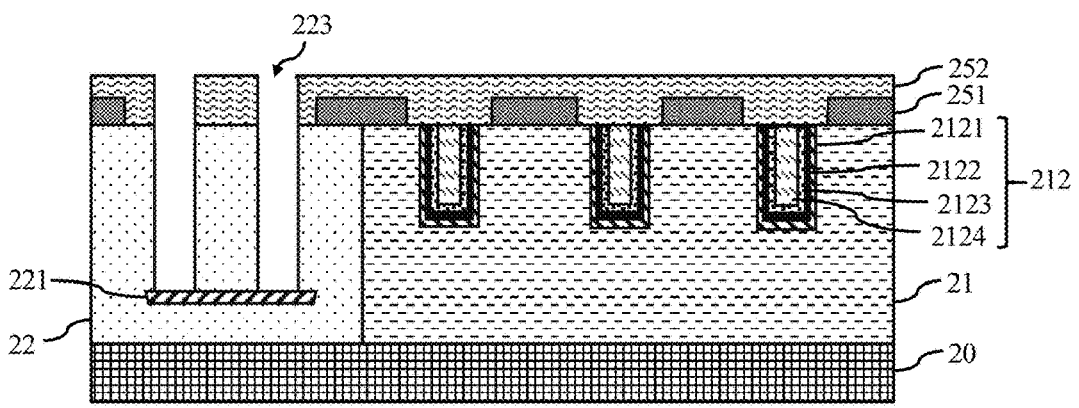

Following that, a third patterned photoresist layer 27 is formed on the second buffer dielectric layer 252 (as shown in FIGS. 3h and 4f), and with the third patterned photoresist layer 27 serving as a mask, the second buffer dielectric layer 252 in the fourth opening 222 and a partial thickness of the substrate 20 is etched through, forming a through hole 223 in the pad region 22 of the substrate 20, in which a top surface of the metal interconnection 221 is exposed (as shown in FIGS. 3i and 4g).

Figure 3J:
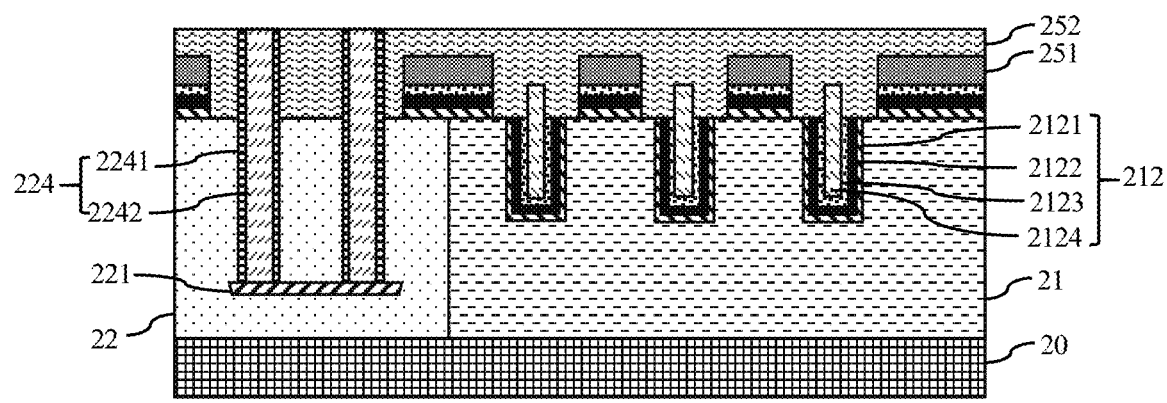
Figure 4H:
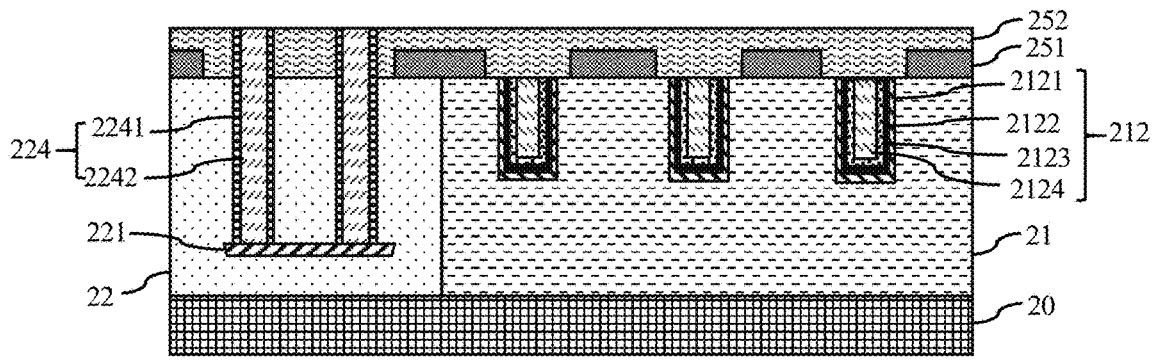

After that, as shown in FIGS. 3j and 4h, a third isolating oxide layer 2241 is formed on a side wall of the through hole 223 so as to cover the substrate 20. A second conductive metal layer 2242 is filled in the through hole 223 so as to also cover the third isolating oxide layer 2241 surrounding the through hole 223. An etching or chemical mechanical polishing process is performed to remove the second conductive metal layer 2242 and the third isolating oxide layer 2241 above the substrate 20 around the through hole 223. As such, the plug structure 224 is formed in the through hole 223. The second conductive metal layer 2242 in the plug structure 224 is electrically connected to the metal interconnection 221.

If the high-k dielectric layer 2122 is formed in the plug structure 224 in the pad region 22, the device will have increased capacitance, which will lead to a significant transmission delay (RC delay) and degradation in the performance of the semiconductor device. Therefore, the high-k dielectric layer 2122 shall not be formed in the plug structure 224 in the pad region 22.

Figure 3K:
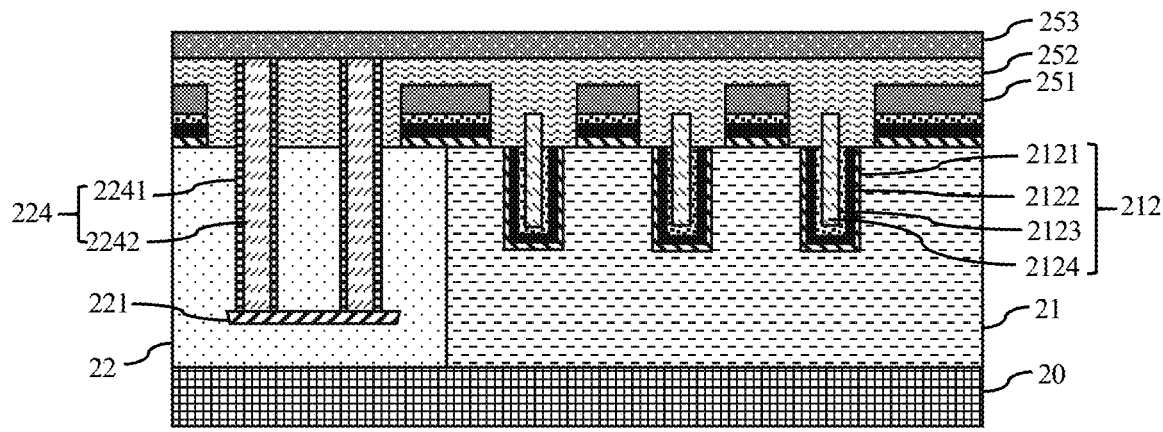
Figure 4I:
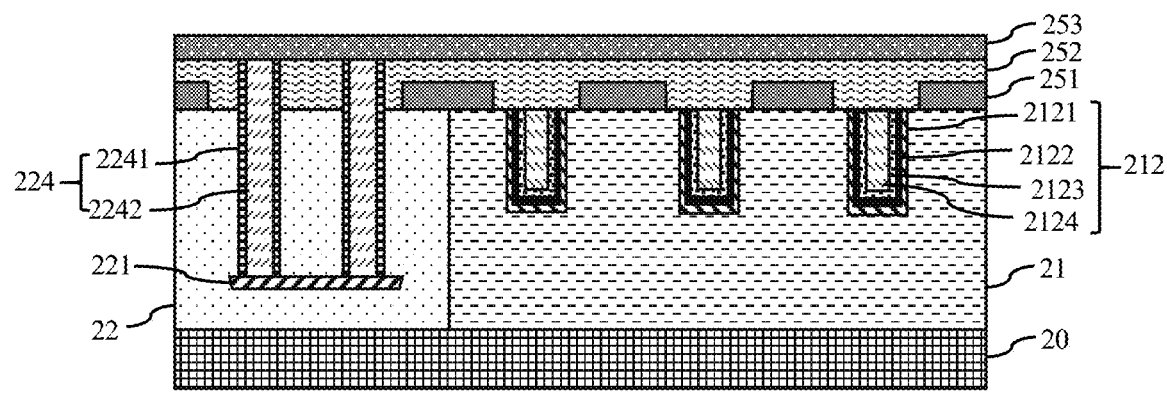

In step S4, a buffer dielectric layer is formed over the substrate 20 in the pixel region 21 and the pad region 22 so that the trench fill structure 212 and the plug structure 224 are embedded in the buffer dielectric layer. As shown in FIGS. 3k and 4i, a third buffer dielectric layer 253 is so formed as to cover the substrate 20 in the pixel region 21 and the pad region 22. It will be appreciated that FIG. 3k shows the buffer dielectric layer being formed by the first isolating oxide layer 2121, the high-k dielectric layer 2122, the second isolating oxide layer 2123, the first buffer dielectric layer 251, the second buffer dielectric layer 252 and the third buffer dielectric layer 253, which cover the substrate 20 and in which the trench fill structure 212 and the plug structure 224 are embedded, and that FIG. 4i shows the buffer dielectric layer being formed by the first buffer dielectric layer 251, the second buffer dielectric layer 252 and the third buffer dielectric layer 253, which cover the substrate 20 and in which the trench fill structure 212 and the plug structure 224 are embedded. Materials from which the first buffer dielectric layer 251, the second buffer dielectric layer 252 and the third buffer dielectric layer 253 can be made may include at least one of silica, silicon nitride, ethyl silicate, borosilicate glass, phosphosilicate glass, boro-phospho-silicate glass and silicon oxynitride.

In step S5, the buffer dielectric layer is etched to form a first opening 214 and a second opening 225, the first opening 214 exposing at least part of the substrate 20 around a top side wall portion of the trench fill structure 212, or at least a top portion of the trench fill structure 212, or both, the second opening 225 exposing at least a top portion of the plug structure 224 and possibly the entirety or part of a top surface of the second conductive metal layer 2242. The exposure of at least part of the substrate 20 around a top side wall portion of the trench fill structure 212 in the first opening 214 means that the first opening 214 is so formed as to at least surround the top of the trench fill structure 212 so that at least part of the substrate 20 around the top of the trench fill structure 212 is exposed.

Figure 3L:
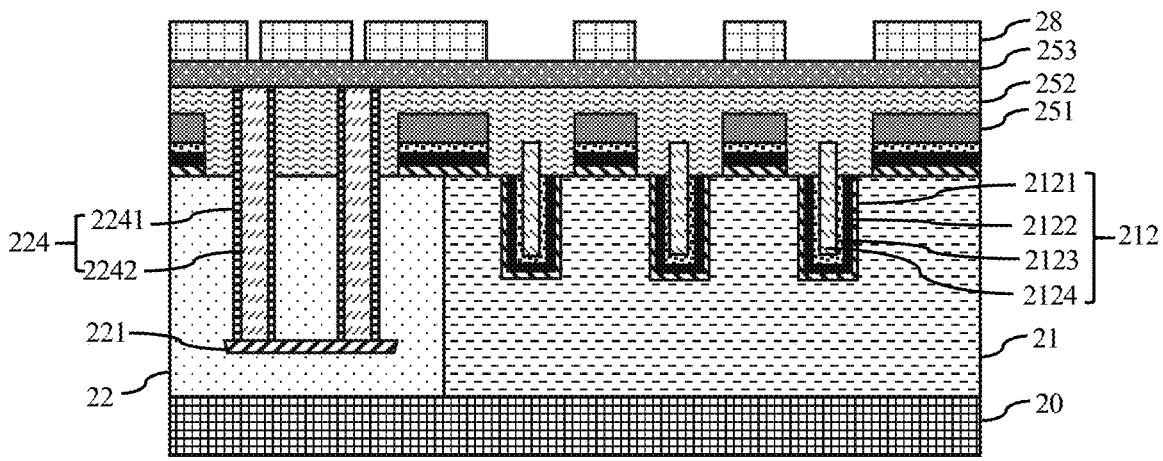
Figure 3M:
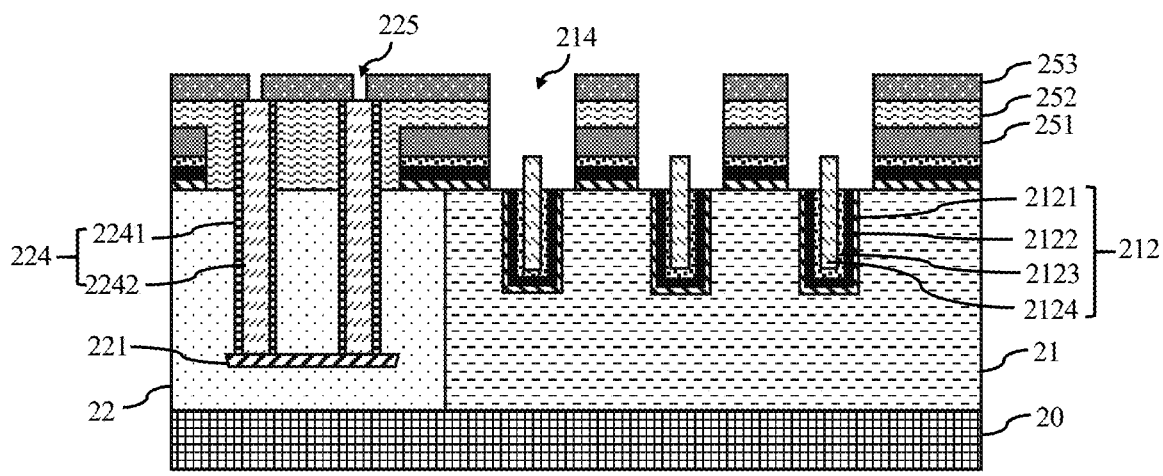
Figure 4J:
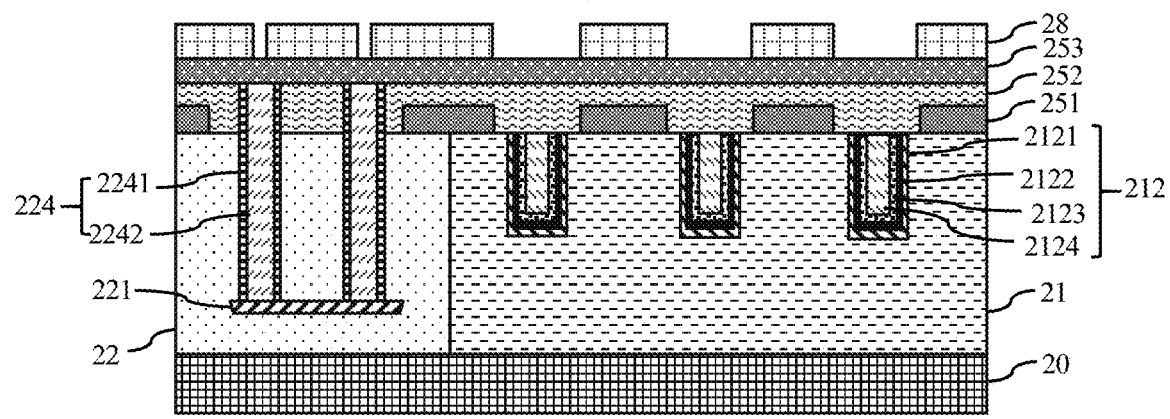
Figure 4K:
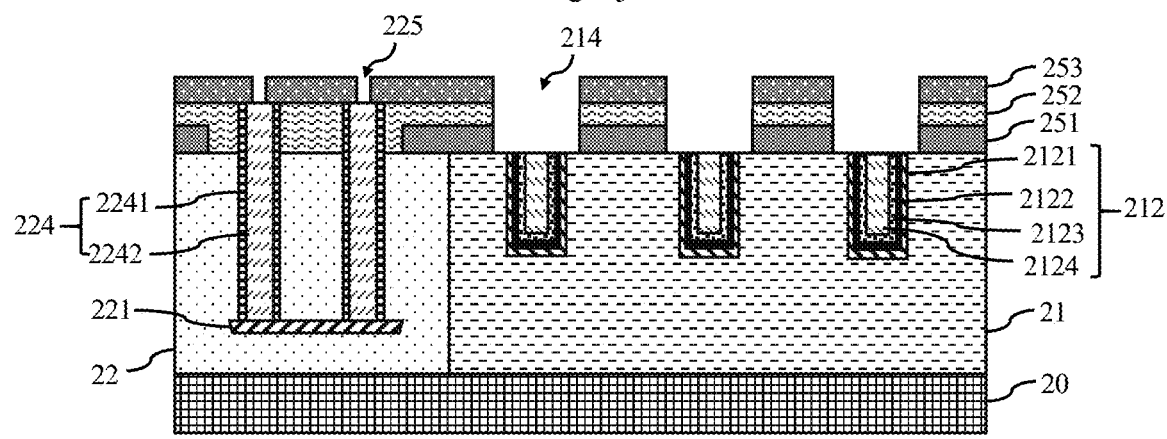

The step in which the buffer dielectric layer is etched to form the first opening 214 and the second opening 225 may include: at first, forming a fourth patterned photoresist layer 28 on the buffer dielectric layer (as shown in FIGS. 3l and 4j), and with the fourth patterned photoresist layer 28 serving as a mask, the buffer dielectric layer is etched, resulting the formation of the first opening 214 in the buffer dielectric layer in the pixel region 21 and the second opening 225 in the buffer dielectric layer in the pad region 22. The first opening 214 exposes at least part of the substrate 20 around a top side wall portion of the trench fill structure 212 and/or at least a top portion of the trench fill structure 212, and the second opening 225 exposes part of a top surface of the plug structure 224. The fourth patterned photoresist layer 28 is then removed. The first opening 214 may exactly coincide with the third opening 213 in position. Alternatively, the first opening 214 is may be located within the third opening 213. Alternatively, the third opening 213 may be located within the first opening 214. When the first opening 214 exactly coincides with the third opening 213 in position, as shown in FIGS. 3m and 4k, the third buffer dielectric layer 253 and the second buffer dielectric layer 252 in the pixel region 21 may be etched to form the first opening 214 at the third opening 213. At the same time, the third buffer dielectric layer 253 in the pad region 22 may be etched to form second opening 225 in the pad region 22 in which the top surface of the plug structure 224 is partially exposed. When the first opening 214 is located in the third opening 213, or when the third opening 213 is located in the first opening 214, etching may be carried out as required to achieve the exposure of part of the substrate 20 around a top side wall portion of the trench fill structure 212 and/or at least a top portion of the trench fill structure 212 in the first opening 214.

The exposure of at least a top portion of the trench fill structure 212 in the first opening 214 may include: when the top surface of the trench fill structure 212 is raised over the top surface of the substrate 20, and if the first opening 214 surrounds only the top side wall portion of the trench fill structure 212 so that the first isolating oxide layer 2121 is exposed at the top side wall portion of the trench fill structure 212, exposure of also part of the substrate 20 around the top side wall portion of the trench fill structure 212 in the first opening 214; when only the top surface of the fill material in the trench fill structure 212 is raised over the top surface of the substrate 20, and if the first opening 214 surrounds only the top side wall portion of the trench fill structure 212, exposure of the fill material in the trench fill structure 212 at the top side wall portion; when the top surface of the trench fill structure 212 is raised over or flush with the top surface of the substrate 20, and if the first opening 214 resides on the top surface of the trench fill structure 212, exposure of part or the entirety of the top surface of the trench fill structure 212, including exposure of part or the entirety of the top surface of the fill material, or exposure of both part or the entirety of the top surface of the fill material and part or the entirety of top surface(s) of the first isolating oxide layer 2121 and/or the high-k dielectric layer 2122 and/or the second isolating oxide layer 2123; and when the top surface of the trench fill structure 212 is raised over the top surface of the substrate 20, exposure of the first isolating oxide layer 2121, the high-k dielectric layer 2122, the second isolating oxide layer 2123 or the fill material in the trench fill structure 212 at the top side wall portion and part or the entirety of the top surface of the trench fill structure 212.

When the fill material includes the first conductive metal layer 2124, the exposure of at least a top portion of the trench fill structure 212 in the first opening 214 may include: exposure of the first conductive metal layer 2124 at the top side wall portion of the trench fill structure 212 in the first opening 214 that is so formed to surround the top side wall portion of the trench fill structure 212; or exposure of part or the entirety of the top surface of the first conductive metal layer 2124 in the trench fill structure 212 in the first opening 214 that resides on the top surface of the trench fill structure 212; or exposure of both the first conductive metal layer 2124 in the trench fill structure 212 at the top side wall portion and part or the entirety of the top surface of the first conductive metal layer 2124 in the trench fill structure 212 in the first opening 214.

With continued reference to FIGS. 4a to 4k, in embodiments of the present application, prior to the formation of the first opening 214 or of the through hole 223, the third opening 213 in which part of the substrate 20 surrounding a top side wall portion of the trench fill structure 212 and the entire top surface of the trench fill structure 212 are exposed is formed (as shown particularly in FIG. 4d). Here, it is also possible to directly form the through hole 223 and then the first opening 214. That is, the third opening 213 may not be formed. Accordingly, the first buffer dielectric layer 251 may also not be formed, and the second buffer dielectric layer 252 is instead directly formed so as to cover the substrate 20 in the pixel region 21 and the pad region 22 and bury the trench fill structure 212. Subsequently, the third patterned photoresist layer 27 is formed on the second buffer dielectric layer 252, and with the third patterned photoresist layer 27 serving as a mask, the second buffer dielectric layer 252 and a partial thickness of the substrate 20 are etched through, resulting the formation of the through hole 223 in the pad region 22 of the substrate 20 in which the top surface of the metal interconnection 221 is exposed. That is, according to embodiments of the present application, in principle, the through hole 223 is formed, and the plug structure 224 is then formed therein so as to be electrically connected to the metal interconnection 221. Additionally, the first opening 214 is formed in which part of the substrate around a top side wall portion of the trench fill structure and/or at least a top portion of the trench fill structure is/are exposed, allowing the subsequently formed metal grid layer to be electrically connected to the exposed part of the substrate and/or the exposed portion of the trench fill structure. The present application is not limited to any particular method of formation. For example, it may be achieved by forming one or more buffer dielectric layers and using appropriate etching processes.

In step S6, a metal grid layer is formed on the buffer dielectric layer in the pixel region 21 so as to fill the first opening 214 and is electrically connected to the exposed part of the substrate 20, the exposed portion of the trench fill structure 212, or both.

Electrically connecting the metal grid layer to the exposed part of the substrate 20 and/or the exposed portion of the trench fill structure 212 can optimize and improve electrical performance, such as dark current performance, of the semiconductor device. Moreover, the high-k dielectric layer 2122 in the trench fill structure 212 can additionally reduce the dark current in the semiconductor device, resulting in further optimization and improvement of the semiconductor device's electrical performance.

Figure 3N:
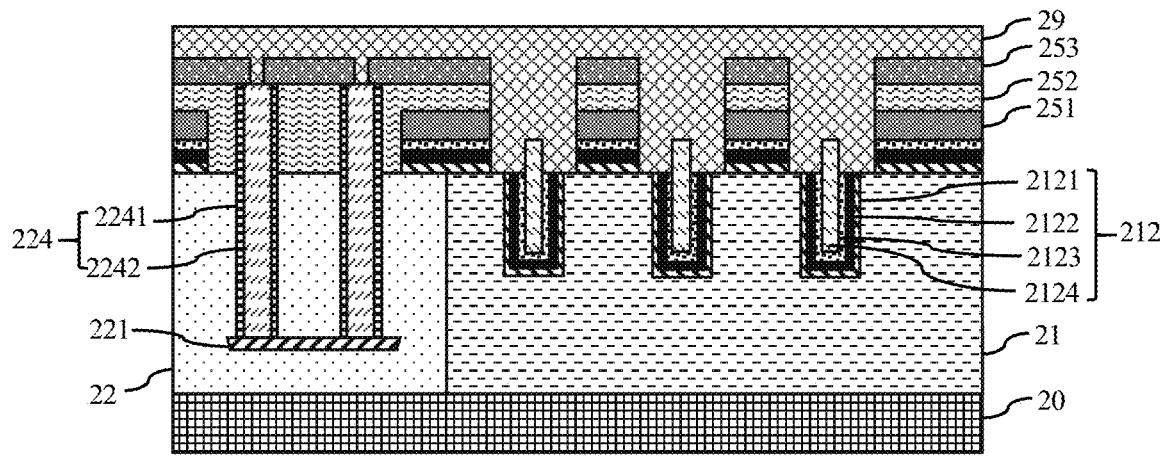
Figure 3O:
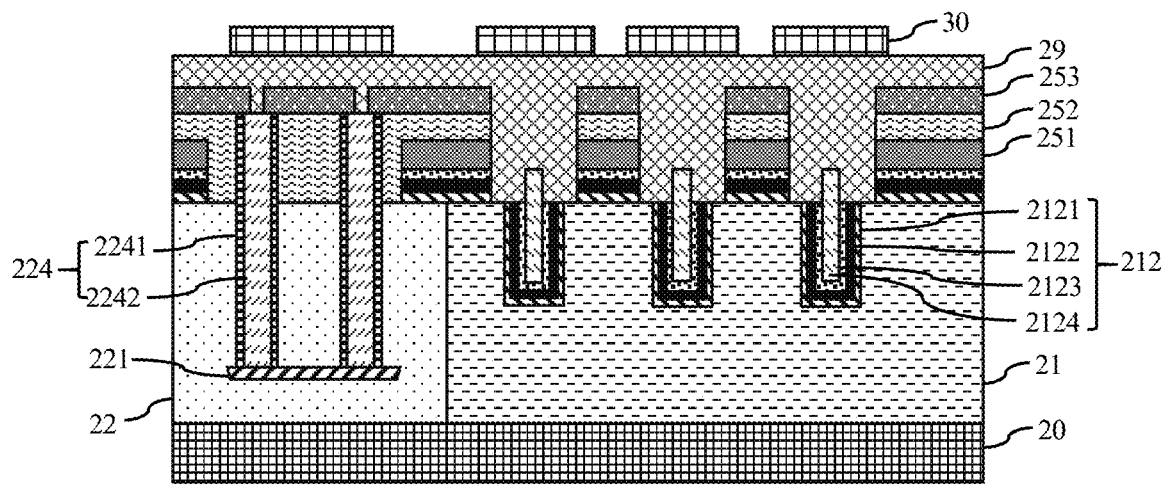
Figure 3P:
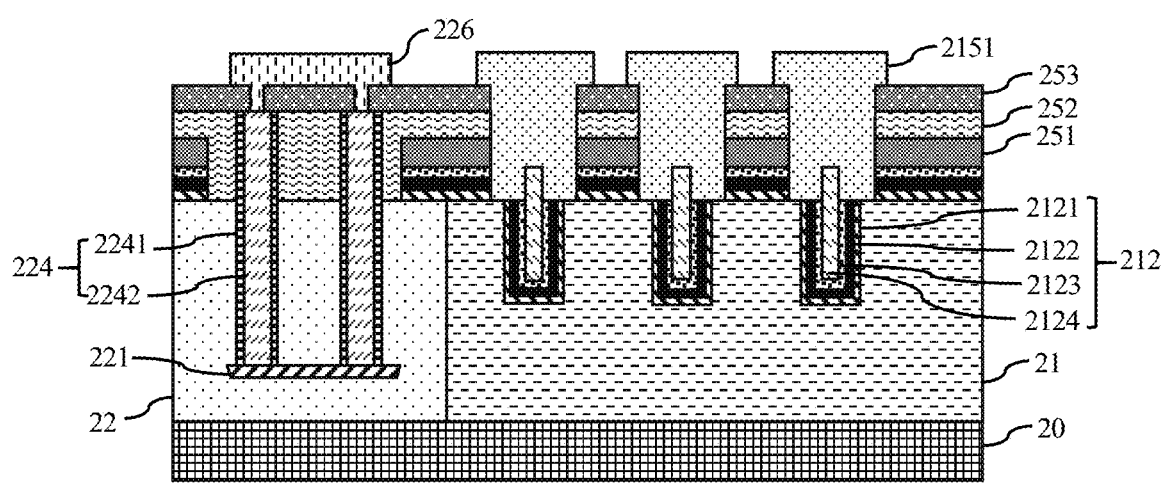
Figure 4L:
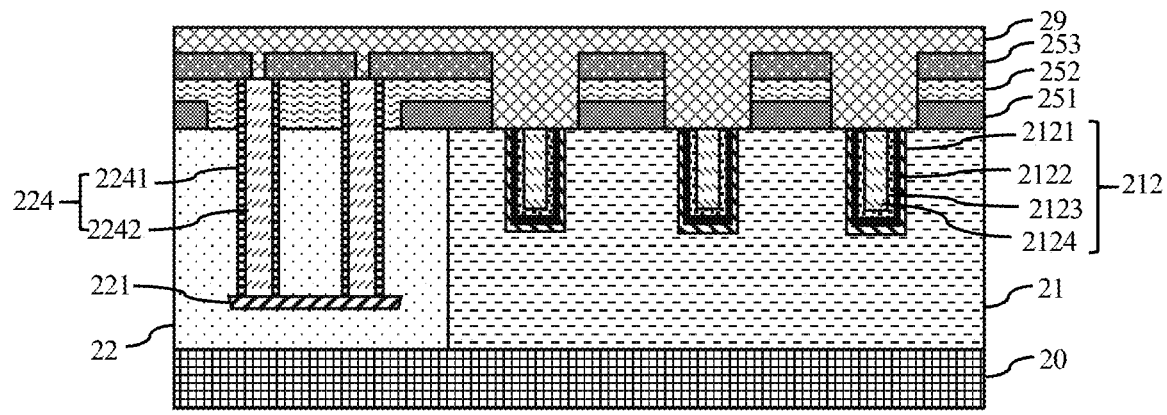
Figure 4M:
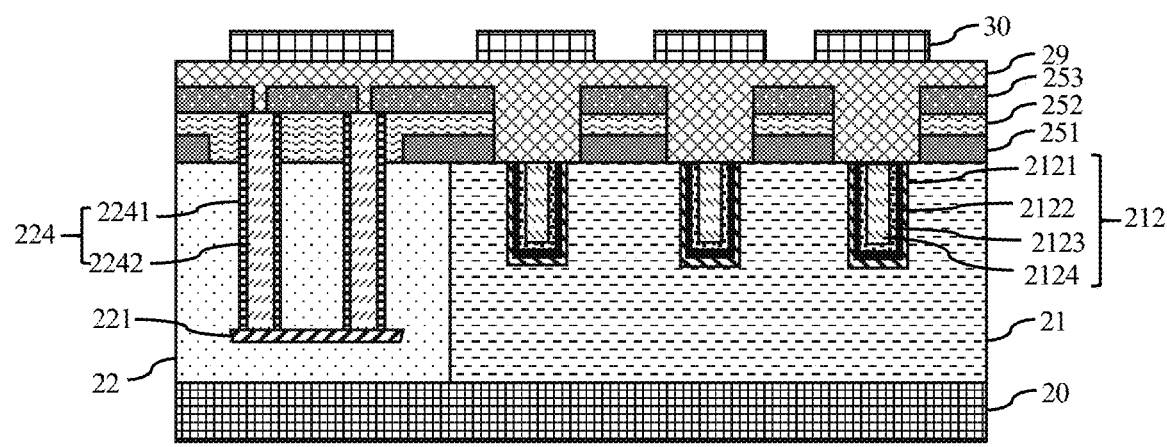

The step in which the metal grid layer is formed on the buffer dielectric layer in the pixel region includes: first of all, as shown in FIGS. 3n and 4l, a third conductive metal layer 29 is formed so as to cover the buffer dielectric layer (i.e., on the third buffer dielectric layer 253, as shown in FIGS. 3n and 4l) and fill up the first opening 214; then, forming a fifth patterned photoresist layer 30 on the third conductive metal layer 29 (as shown in FIGS. 3o and 4m) and, with the fifth patterned photoresist layer 30 serving as a mask, etching the third conductive metal layer 29, resulting in the formation of the metal grid layer in the pixel region 21 (as shown in FIGS. 3p, 4n, 5, 6 and 7), which is electrically connected to the part of the substrate 20 and/or the portion of the trench fill structure 212 exposed in the first opening 214; and removing the fifth patterned photoresist layer 30. The third conductive metal layer 29 can be made of material including at least one of nickel, aluminum, silver, gold, titanium and copper.

Further, when only part of the substrate 20 is exposed in the first opening 214, the metal grid layer is electrically connected to only the exposed part of the substrate 20. When at least a top portion of the trench fill structure 212 is exposed in the first opening 214, in consistence with the scenarios enumerated in connection with the description of step S5, the electrical connection of the metal grid layer with the underlying structure includes: when the top surface of the trench fill structure 212 is raised over the top surface of the substrate 20, and if the first opening 214 surrounds only a top side wall portion of the trench fill structure 212 (i.e., the first isolating oxide layer 2121 is exposed at the top side wall portion), electrical connection of the metal grid layer also with only the exposed part of the substrate 20; when only the top surface of the fill material in the trench fill structure 212 is raised over the top surface of the substrate 20 and the first opening 214 surrounds only a top side wall portion of the trench fill structure 212, and if the fill material is the first conductive metal layer 2124, electrical connection of the metal grid layer with the first conductive metal layer 2124 at the top side wall portion of the trench fill structure 212; when the top surface of the trench fill structure 212 is raised over or flush with the top surface of the substrate 20 and the first opening 214 resides on the top surface of the fill material in the trench fill structure 212, and if the fill material is the first conductive metal layer 2124, electrical connection of the metal grid layer with the partially or entirely exposed top surface of the first conductive metal layer 2124 in the trench fill structure 212; when the top surface of the trench fill structure 212 is raised over the top surface of the substrate 20, and if the first opening 214 exposes both the isolating oxide layer 2121 or the first conductive metal layer 2124 at a top side wall portion of the trench fill structure 212 and part or the entirety of the top surface of the first conductive metal layer 2124, electrical connection of the metal grid layer with both the part of the substrate 20 and the first conductive metal layer 2124.

Figure 4N:
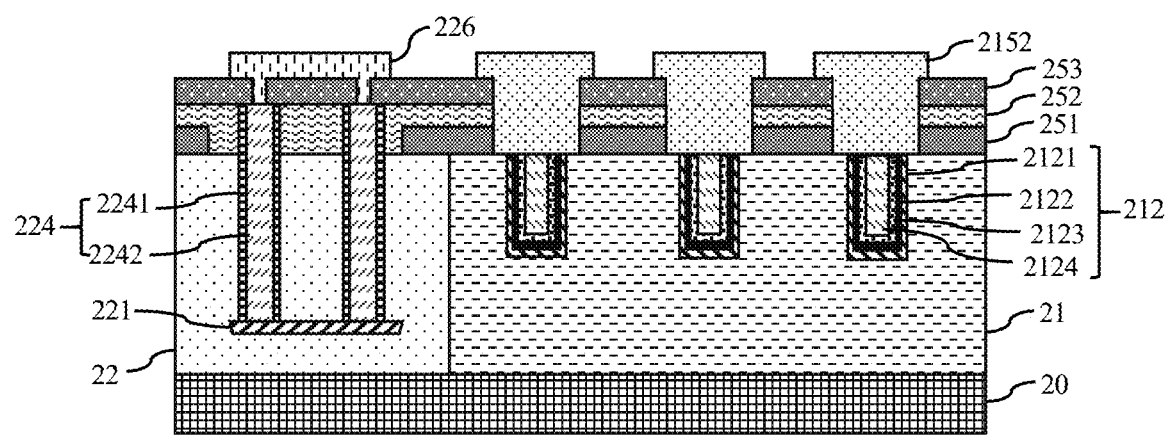
Figure 5:
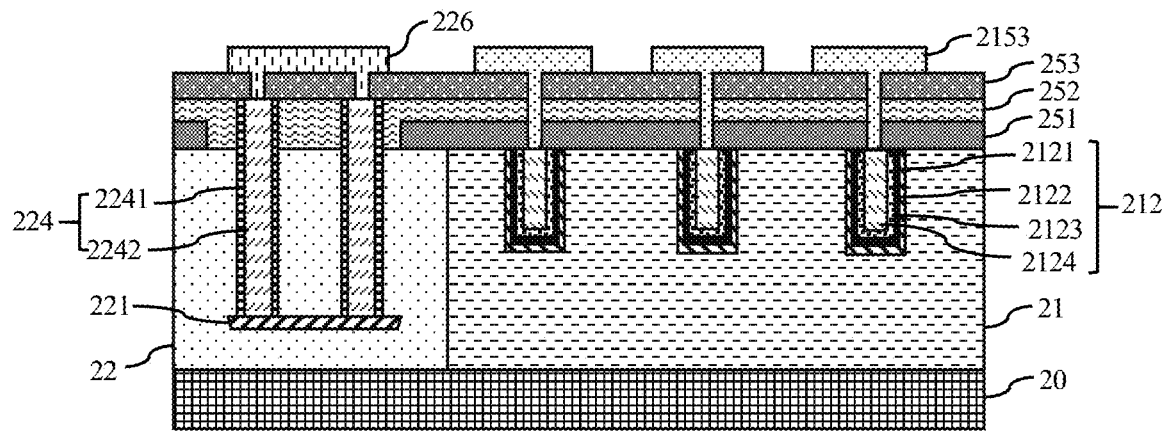
FIG. 5 is a schematic diagram showing a device fabricated in a third embodiment of the method of FIG. 2.
Figure 6:
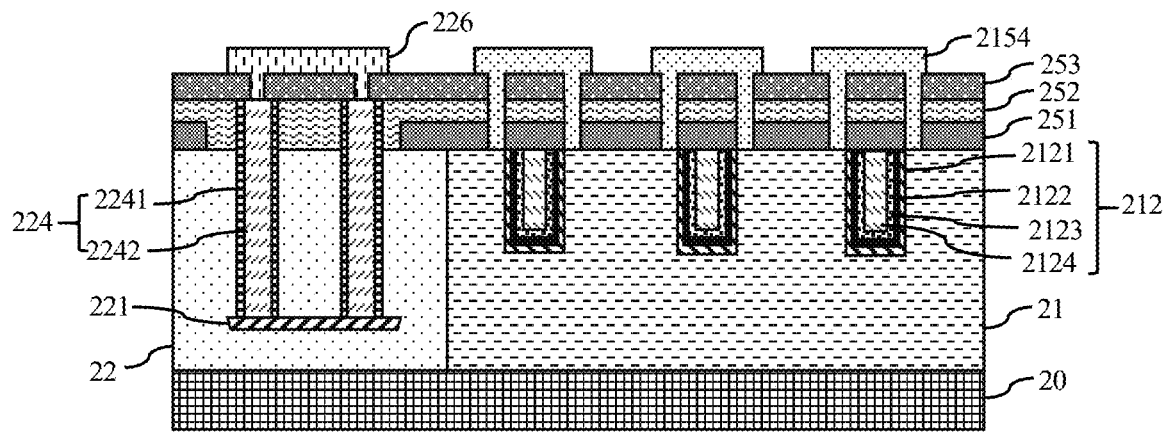
FIG. 6 is a schematic diagram showing a device fabricated in a fourth embodiment of the method of FIG. 2.
Figure 7:
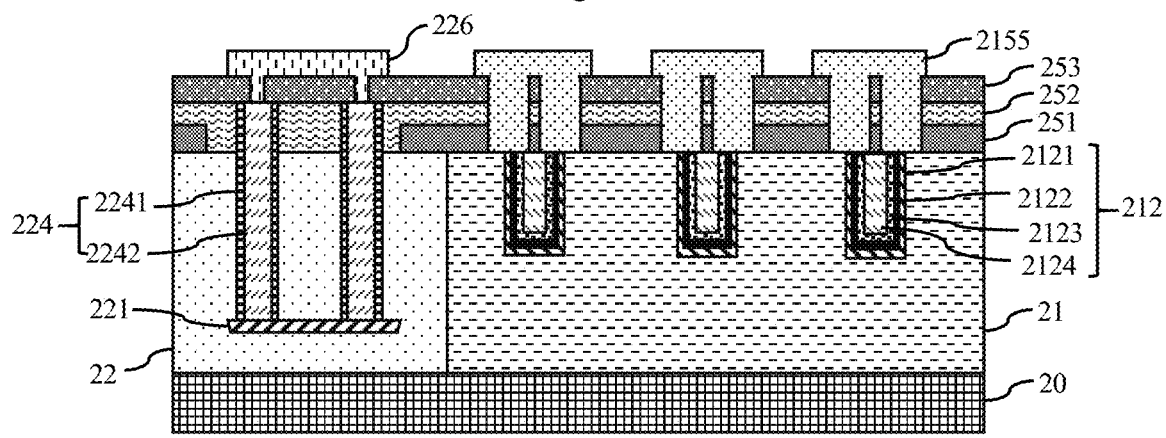
FIG. 7 is a schematic diagram showing a device fabricated in a fifth embodiment of the method of FIG. 2.

Examples of the electrical connection of the metal grid layer with the exposed part of the substrate 20 and/or the exposed portion of the trench fill structure 212 may include: as shown in FIG. 3p, electrical connection of the metal grid layer 2151 with part of the substrate 20 around a top side wall portion of the trench fill structure 212 and the entire top surface of the trench fill structure 212 exposed in the first opening 214 and contact of the metal grid layer 2151 with the a top side wall portion of the first conductive metal layer 2124; as shown in FIG. 4n, electrical connection of the metal grid layer 2152 with part of the substrate 20 around a top side wall portion of the trench fill structure 212 and the entire top surface of the trench fill structure 212 exposed in the first opening 214; as shown in FIG. 5, electrical connection of the metal grid layer 2153 with an exposed portion of the top surface of the first conductive metal layer 2124 in the trench fill structure 212 exposed in the first opening 214; as shown in FIG. 6, electrical connection of the metal grid layer 2154 with part of the substrate 20 around a top side wall portion of the trench fill structure 212 exposed in the first opening 214; as shown in FIG. 7, electrical connection of the metal grid layer 2155 to part of the substrate 20 around a top side wall portion of the trench fill structure 212 and part of the top surface of the first conductive metal layer 2124 in the trench fill structure 212 both exposed in the first opening 214.

Further, at the same time when the metal grid layer is formed on the buffer dielectric layer in the pixel region 21, a pad structure 226 is formed on the buffer dielectric layer in the pad region 22 so as to fill up the second opening 225 and be electrically connected to the exposed top portion of the plug structure 224. As shown in FIGS. 3p, 4n, 5, 6 and 7, the pad structure 226 is electrically connected to the top of the second conductive metal layer 2242 in the exposed plug structure 224.

Furthermore, in the above method, the individual steps are not limited to being performed in the above-described sequential order, and the order may be adapted as appropriate.

In summary, the method of manufacturing a semiconductor device provided in the present invention includes: providing a substrate with a pixel region and a pad region; forming a trench in the pixel region of the substrate and filling the trench with a fill material, thus forming a trench fill structure, wherein a high-k dielectric layer is sandwiched between a side wall of the fill material and the substrate; forming a plug structure in the pad region of the substrate; forming a buffer dielectric layer over both the pixel and pad regions of the substrate so that both the trench fill structure and the plug structure are embedded in the buffer dielectric layer; etching the buffer dielectric layer to form a first opening and a second opening, the first opening exposing at least part of the substrate around a top side wall portion of the trench fill structure and/or at least a top portion of the trench fill structure, the second opening exposing at least a top portion of the plug structure; and forming a metal grid layer on the buffer dielectric layer in the pixel region so that the metal grid layer fills the first opening and is electrically connected to the exposed part of the substrate and/or the exposed portion of the trench fill structure. In this method, electrically connecting the metal grid layer to the exposed part of the substrate and/or the exposed portion of the trench fill structure optimizes and improves electrical performance of the semiconductor device.

In an embodiment of the present invention, there is also provided a semiconductor device including a substrate, a trench fill structure, a plug structure, a buffer dielectric layer and a metal grid layer. The substrate has a pixel region and a pad region. The trench fill structure is formed in the pixel region of the substrate and includes a fill material filled in a trench in the substrate and a high-k dielectric layer sandwiched between a side wall of the fill material and the substrate. The plug structure is formed in the pad region of the substrate. The buffer dielectric layer is formed over a surface of the substrate in the pixel region and the pad region and has a first opening and a second opening. The first opening exposes at least part of the substrate around a top side wall portion of the trench fill structure and/or at least a top portion of the trench fill structure, and the second opening exposes at least a top portion of the plug structure. The metal grid layer is formed on the buffer dielectric layer in the pixel region such as to fill the first opening and be electrically connected to the exposed part of the substrate and/or the exposed portion of the trench fill structure.

The semiconductor device provided in the present embodiment will be described in greater detail below with reference to FIGS. 3p, 4n, 5, 6 and 7.

The substrate 20 includes the pixel region 21 and the pad region 22, the pad region 22 is peripheral to the pixel region 21. The substrate 20 may be any suitable material well known to those skilled in the art. For more details in this regard, reference can be made to the description of step S1, and a further description thereof is omitted here.

A metal interconnection 221 is formed in the pad region 22 of the substrate 20. It is to be noted that other metal structures than the metal interconnection 221, such as a conductive contact plug, may also be formed in the pad region 22 of the substrate 20. These metal structures are exemplified below by the metal interconnection 221.

The trench fill structure 212 is formed in the pixel region 21 of the substrate 20. The trench fill structure 212 includes the fill material filled in the trench 211 in the substrate 20 and the high-k dielectric layer 2122 sandwiched between the side wall of the fill material and the substrate 20.

The trench 211 may be a deep trench with a depth of 1-5 μm. It is to be noted that the depth of the trench 211 is not limited to being within the above range and may be appropriately determined according to performance requirements for the semiconductor device. The trench fill structure 212 may serve to isolate components in the pixel region 21 of the substrate 20. The high-k dielectric layer 2122 is preferred to have a k (dielectric permittivity) value of greater than 7. Materials from which the high-k dielectric layer 2122 can be made may include, but are not limited to, nitrides and metal oxides such as silicon nitride, silicon oxynitride, titanium dioxide, tantalum pentoxide, etc.

When the high-k dielectric layer 2122 is formed in the trench fill structure 212 in the pixel region 21, since the high-k dielectric layer 2122 operates at a voltage in a different band and has different charge properties, the high-k dielectric layer 2122 will change the charge in the substrate 20 and reduce a dark current that may produce noise harmful to the performance of the semiconductor device.

The trench fill structure 212 may include a first isolating oxide layer 2121, the high-k dielectric layer 2122 and a second isolating oxide layer 2123, which are sequentially stacked over a surface of the trench 211 in the substrate 20, and the fill material filled in the trench 211. The first isolating oxide layer 2121, the high-k dielectric layer 2122 and the second isolating oxide layer 2123 are arranged at least between the side wall of the fill material and the substrate 20. That is, the first isolating oxide layer 2121, the high-k dielectric layer 2122 and the second isolating oxide layer 2123 in the trench 211 may reside either on only a side wall of the trench 211 or on both the side wall and a bottom wall of the trench 211.

The fill material may include a dielectric material, or a metallic material, or both. When the fill material is a metallic material, the trench fill structure 212 includes the first isolating oxide layer 2121, the high-k dielectric layer 2122 and the second isolating oxide layer 2123, all formed over the surface of the trench 211, and a first conductive metal layer 2124 that fills up the trench 211 (i.e., the fill material provides the first conductive metal layer 2124). The dielectric material may include at least one of silica, silicon nitride, ethyl silicate, borosilicate glass, phosphosilicate glass, boro-phospho-silicate glass and silicon oxynitride, and the metallic material may include at least one of tungsten, nickel, aluminum, silver, gold and titanium.

Additionally, a top surface of the trench fill structure 212 may be flush with the top surface of the substrate 20. Alternatively, the top surface of the trench fill structure 212 may be higher than the top surface of the substrate 20. Alternatively, only a top surface of the fill material in the trench fill structure 212 may be higher than the top surface of the substrate 20.

The plug structure 224 is formed in the pad region 22 of the substrate 20. The plug structure 224 includes: a third isolating oxide layer 2241 on a side wall of a through hole 223 in which part of the top surface of the metal interconnection 221 is exposed; and a second conductive metal layer 2242 filling up the through hole 223. The second conductive metal layer 2242 is electrically connected at the bottom to the metal interconnection 221. The second conductive metal layer 2242 may be made of a material including at least one of tungsten, nickel, aluminum, silver, gold and titanium.

If the high-k dielectric layer 2122 is formed in the plug structure 224 in the pad region 22, the device will have increased capacitance, which will lead to a significant transmission delay (RC delay) and degradation in the performance of the semiconductor device. Therefore, the high-k dielectric layer 2122 shall not be formed in the plug structure 224 in the pad region 22.

The buffer dielectric layer is formed on the surface of the substrate 20 in the pixel region 21 and the pad region 22. The buffer dielectric layer has the first opening 214 and the second opening 225. The first opening 214 exposes at least part of the substrate 20 around a top side wall portion of the trench fill structure 212 or at least a top portion of the trench fill structure 212. Alternatively, it exposes at least part of the substrate 20 around a top side wall portion of the trench fill structure 212 and at least a top portion of the trench fill structure 212. The second opening 225 exposes at least a top portion of the plug structure 224. The exposure of at least part of the substrate 20 around a top side wall portion of the trench fill structure 212 in the first opening 214 means that the first opening 214 is so formed as to at least surround the top of the trench fill structure 212 so that at least part of the substrate 20 around the top of the trench fill structure 212 is exposed.

It will be appreciated that FIG. 3p shows the buffer dielectric layer being formed by the first isolating oxide layer 2121, the high-k dielectric layer 2122, the second isolating oxide layer 2123, the first buffer dielectric layer 251, the second buffer dielectric layer 252 and the third buffer dielectric layer 253, which cover the substrate 20 in the pixel region 21. FIGS. 4n, 5, 6 and 7 show the buffer dielectric layer being formed by the first buffer dielectric layer 251, the second buffer dielectric layer 252 and the third buffer dielectric layer 253, which cover the substrate 20 in the pixel region 21. FIGS. 3p, 4n, 5, 6 and 7 show the buffer dielectric layer in the pad region 22 being formed by the third buffer dielectric layer 253 covering the substrate 20 in the pad region 22. Materials from which the first buffer dielectric layer 251, the second buffer dielectric layer 252 and the third buffer dielectric layer 253 can be made may include at least one of silica, silicon nitride, ethyl silicate, borosilicate glass, phosphosilicate glass, boro-phospho-silicate glass and silicon oxynitride.

The exposure of at least a top portion of the trench fill structure 212 in the first opening 214 may include: when the top surface of the trench fill structure 212 is raised over the top surface of the substrate 20, and if the first opening 214 surrounds only the top side wall portion of the trench fill structure 212 so that the first isolating oxide layer 2121 is exposed at the top side wall portion of the trench fill structure 212, exposure of also part of the substrate 20 around the top side wall portion of the trench fill structure 212 in the first opening 214; when only the top surface of the fill material in the trench fill structure 212 is raised over the top surface of the substrate 20, and if the first opening 214 surrounds only the top side wall portion of the trench fill structure 212, exposure of the fill material in the trench fill structure 212 at the top side wall portion; when the top surface of the trench fill structure 212 is raised over or flush with the top surface of the substrate 20, and if the first opening 214 resides on the top surface of the trench fill structure 212, exposure of part or the entirety of the top surface of the trench fill structure 212, including exposure of part or the entirety of the top surface of the fill material, or exposure of both part or the entirety of the top surface of the fill material and part or the entirety of top surface(s) of the first isolating oxide layer 2121 and/or the high-k dielectric layer 2122 and/or the second isolating oxide layer 2123; and when the top surface of the trench fill structure 212 is raised over the top surface of the substrate 20, exposure of the first isolating oxide layer 2121, the high-k dielectric layer 2122, the second isolating oxide layer 2123 or the fill material in the trench fill structure 212 at the top side wall portion and part or the entirety of the top surface of the trench fill structure 212.

When the fill material includes the first conductive metal layer 2124, the exposure of at least a top portion of the trench fill structure 212 in the first opening 214 may include: exposure of the first conductive metal layer 2124 at the top side wall portion of the trench fill structure 212 in the first opening 214 that is so formed to surround the top side wall portion of the trench fill structure 212; or exposure of part or the entirety of the top surface of the first conductive metal layer 2124 in the trench fill structure 212 in the first opening 214 that resides on the top surface of the trench fill structure 212; or exposure of both the first conductive metal layer 2124 in the trench fill structure 212 at the top side wall portion and part or the entirety of the top surface of the first conductive metal layer 2124 in the trench fill structure 212 in the first opening 214.

The metal grid layer is formed on the buffer dielectric layer in the pixel region 21 so as to fill the first opening 214 and be electrically connected to the exposed part of the substrate 20, the exposed portion of the trench fill structure 212, or be electrically connected to both the exposed part of the substrate 20 and the exposed portion of the trench fill structure 212. The metal grid layer may be formed of a material including at least one of tungsten, nickel, aluminum, silver, gold and titanium.

Electrically connecting the metal grid layer to the exposed part of the substrate 20 and/or the exposed portion of the trench fill structure 212 can optimize and improve electrical performance, such as dark current performance, of the semiconductor device. Moreover, the high-k dielectric layer 2122 in the trench fill structure 212 can additionally reduce the dark current in the semiconductor device, resulting in further optimization and improvement of the semiconductor device's electrical performance.

When only part of the substrate 20 is exposed in the first opening 214, the metal grid layer is electrically connected to only the exposed part of the substrate 20. When at least a top portion of the trench fill structure 212 is exposed in the first opening 214, in consistence with the above enumerated scenarios, the electrical connection of the metal grid layer with the underlying structure includes: when the top surface of the trench fill structure 212 is raised over the top surface of the substrate 20, and if the first opening 214 surrounds only a top side wall portion of the trench fill structure 212 (i.e., the first isolating oxide layer 2121 is exposed at the top side wall portion), electrical connection of the metal grid layer also with only the exposed part of the substrate 20; when only the top surface of the fill material in the trench fill structure 212 is raised over the top surface of the substrate 20 and the first opening 214 surrounds only a top side wall portion of the trench fill structure 212, and if the fill material is the first conductive metal layer 2124, electrical connection of the metal grid layer with the first conductive metal layer 2124 at the top side wall portion of the trench fill structure 212; when the top surface of the trench fill structure 212 is raised over or flush with the top surface of the substrate 20 and the first opening 214 resides on the top surface of the fill material in the trench fill structure 212, and if the fill material is the first conductive metal layer 2124, electrical connection of the metal grid layer with the partially or entirely exposed top surface of the first conductive metal layer 2124 in the trench fill structure 212; when the top surface of the trench fill structure 212 is raised over the top surface of the substrate 20, and if the first opening 214 exposes both the isolating oxide layer 2121 or the first conductive metal layer 2124 at a top side wall portion of the trench fill structure 212 and part or the entirety of the top surface of the first conductive metal layer 2124, electrical connection of the metal grid layer with both the part of the substrate 20 and the first conductive metal layer 2124.

Exemplary scenarios of the electrical connection of the metal grid layer with the exposed part of the substrate 20 and/or the exposed portion of the trench fill structure 212 may include: as shown in FIG. 3p, electrical connection of the metal grid layer 2151 with part of the substrate 20 around a top side wall portion of the trench fill structure 212 and the entire top surface of the trench fill structure 212, both exposed in the first opening 214, with contact of the metal grid layer 2151 with a top side wall portion of the first conductive metal layer 2124; as shown in FIG. 4n, electrical connection of the metal grid layer 2152 with part of the substrate 20 around a top side wall portion of the trench fill structure 212 and the entire top surface of the trench fill structure 212, both exposed in the first opening 214; as shown in FIG. 5, electrical connection of the metal grid layer 2153 with part of the top surface of the first conductive metal layer 2124 in the trench fill structure 212 exposed in the first opening 214; as shown in FIG. 6, electrical connection of the metal grid layer 2154 with part of the substrate 20 around a top side wall portion of the trench fill structure 212 exposed in the first opening 214; as shown in FIG. 7, electrical connection of the metal grid layer 2155 to part of the substrate 20 around a top side wall portion of the trench fill structure 212 and part of the top surface of the first conductive metal layer 2124 in the trench fill structure 212, both exposed in the first opening 214.

By electrically connecting the metal grid layer with the substrate to form a conductive loop, it is possible to apply a voltage to the backside of the substrate, so that the semiconductor device provided in the present embodiment can be applied to some special devices, such as TOF SPAD devices. TOF SPAD is short for Single-photon avalanche diodes based on time-of-flight, which need to work in Geiger mode, and generally requires a voltage of 20V and above on the backside of the substrate of the TOF SPAD device.

Further, a pad structure 226 is further formed on the buffer dielectric layer in the pad region 22 so as to fill up the second opening 225 and be electrically connected to the exposed top portion of the plug structure 224. As shown in FIGS. 3p, 4n, 5, 6 and 7, the pad structure 226 is electrically connected to the top of the second conductive metal layer 2242 in the exposed plug structure 224.

In summary, the semiconductor device provided in the present invention includes: a substrate having a pixel region and a pad region; a trench fill structure formed in the pixel region of the substrate, the trench fill structure including a fill material filled in a trench in the substrate and a high-k dielectric layer sandwiched between a side wall of the fill material and the substrate; a plug structure formed in the pad region of the substrate; a buffer dielectric layer formed over a surface of the substrate in the pixel region and the pad region, the buffer dielectric layer having a first opening and a second opening, the first opening exposing at least part of the substrate around a top side wall portion of the trench fill structure and/or at least a top portion of the trench fill structure, the second opening exposing at least a top portion of the plug structure; and a metal grid layer formed on the buffer dielectric layer in the pixel region such as to fill the first opening and be electrically connected to the exposed part of the substrate and/or the exposed portion of the trench fill structure. In the semiconductor device of the present invention, the metal grid layer is electrically connected to the exposed part of the substrate and/or the exposed portion of the trench fill structure, resulting in optimized and improved electrical performance of the semiconductor device.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:
1. A method of manufacturing a semiconductor device, comprising:
providing a substrate with a pixel region and a pad region;
forming a trench fill structure in the pixel region of the substrate;
forming a plug structure in the pad region of the substrate;
forming a buffer dielectric layer over both the pixel region and the pad region of the substrate so that both the trench fill structure and the plug structure are embedded in the buffer dielectric layer;

etching the buffer dielectric layer to form a first opening and a second opening, the first opening exposing at least part of the substrate around a top side wall portion of the trench fill structure and/or at least a top portion of the trench fill structure, the second opening exposing at least a top portion of the plug structure; and forming a metal grid layer on the buffer dielectric layer in the pixel region so that the metal grid layer fills the first opening and is electrically connected to the exposed part of the substrate and/or the exposed portion of the trench fill structure, wherein the trench fill structure comprises a high-k dielectric layer, the high-k dielectric layer being sandwiched between a side wall of a fill material and the substrate.

2. The method of manufacturing a semiconductor device of claim 1, wherein the step of forming the trench fill structure in the pixel region of the substrate comprises:

covering a surface of the substrate in the pixel region and the pad region with a pad oxide layer;

forming a first patterned photoresist layer on the pad oxide layer and, with the first patterned photoresist layer serving as a mask, etching through the pad oxide layer and at least a partial thickness of the substrate in the pixel region, thereby forming a trench in the pixel region of the substrate;

removing the first patterned photoresist layer and the pad oxide layer;

successively forming a first isolating oxide layer, the high-k dielectric layer and a second isolating oxide layer in the trench and on the surface of the substrate in the pixel region and the pad region;

filling the fill material in the trench in such a manner that the fill material also covers the second isolating oxide layer outside the trench; and performing an etching or chemical mechanical polishing process to remove the fill material, the second isolating oxide layer, the high-k dielectric layer and the first isolating oxide layer above the surface of the substrate outside the trench, or to remove only the fill material above the surface of the substrate outside the trench, thereby forming the trench fill structure in the trench.

3. The method of manufacturing a semiconductor device of claim 2, wherein a metal interconnection is formed in the pad region of the substrate, and wherein the step of forming the plug structure in the pad region of the substrate comprises:

covering the substrate in the pixel region and the pad region with a first buffer dielectric layer so that the trench fill structure is embedded in the first buffer dielectric layer;

forming a second patterned photoresist layer on the first buffer dielectric layer and, with the second patterned photoresist layer serving as a mask, etching the first buffer dielectric layer, or the first buffer dielectric layer, the second isolating oxide layer, the high-k dielectric layer and the first isolating oxide layer, thereby forming a third opening exposing at least part of the substrate around a top side wall portion of the trench fill structure and/or at least a top portion of the trench fill structure in the pixel region, and a fourth opening exposing part of a top surface of the substrate is exposed in the pad region, the fourth opening overlying the metal interconnection, wherein the third opening is located at the same position as the first opening;

forming a second buffer dielectric layer on the first buffer dielectric layer so that the second buffer dielectric layer fills up both the third and fourth openings;

forming a third patterned photoresist layer on the second buffer dielectric layer and, with the third patterned photoresist layer serving as a mask, etching through the second buffer dielectric layer and a partial thickness of the substrate in the fourth opening, thereby forming a through hole in the substrate in the pad region in which a top surface of the metal interconnection is exposed; and forming a third isolating oxide layer on a side wall of the through hole and filling a second conductive metal layer in the through hole, thereby forming the plug structure in the through hole, the plug structure is electrically connected at the bottom of the second conductive metal layer to the metal interconnection.

4. The method of manufacturing a semiconductor device of claim 1, wherein the trench fill structure comprises a first conductive metal layer, and wherein the exposure of at least a top portion of the trench fill structure in the first opening comprises: exposure of the first conductive metal layer at a top side wall portion of the trench fill structure in the first opening that is so formed as to surround the top side wall portion of the trench fill structure; and/or exposure of part or the entirety of a top surface of the first conductive metal layer in the trench fill structure in the first opening that resides on a top surface of the trench fill structure.

5. The method of manufacturing a semiconductor device of claim 1, wherein the step of forming the first and second openings by etching the buffer dielectric layer comprises:

forming a fourth patterned photoresist layer on the buffer dielectric layer and, with the fourth patterned photoresist layer serving as a mask, etching the buffer dielectric layer, thereby forming the first opening in the buffer dielectric layer in the pixel region and the second opening in the buffer dielectric layer in the pad region, the first opening exposing at least part of the substrate around a top side wall portion of the trench fill structure and/or at least a top portion of the trench fill structure, the second opening exposing at least a top portion of the plug structure; and removing the fourth patterned photoresist layer.

6. The method of manufacturing a semiconductor device of claim 1, wherein the step of forming the metal grid layer on the buffer dielectric layer in the pixel region comprises:

forming a third conductive metal layer, which covers the buffer dielectric layer and fills up the first opening;

forming a fifth patterned photoresist layer on the third conductive metal layer and, with the fifth patterned photoresist layer serving as a mask, etching the third conductive metal layer, thus forming the metal grid layer in the pixel region, the metal grid layer is electrically connected to the part of the substrate and/or the portion of the trench fill structure exposed in the first opening; and removing the fifth patterned photoresist layer.

7. The method of manufacturing a semiconductor device of claim 1, wherein at the same time when the metal grid layer is formed on the buffer dielectric layer in the pixel region, a pad structure is formed on the buffer dielectric layer in the pad region, the pad structure filling the second opening and being electrically connected to the exposed top portion of the plug structure.

8. A semiconductor device, comprising:

a substrate with a pixel region and a pad region, the substrate comprising a trench formed in the pixel region;

a trench fill structure formed in the pixel region of the substrate;

a plug structure formed in the pad region of the substrate;
a buffer dielectric layer formed over a surface of the substrate in the pixel region and the pad region, the buffer dielectric layer having a first opening and a second opening, the first opening exposing at least part of the substrate around a top side wall portion of the trench fill structure and/or at least a top portion of the trench fill structure, the second opening exposing at least a top portion of the plug structure; and
a metal grid layer formed on the buffer dielectric layer in the pixel region such as to fill the first opening and be electrically connected to the exposed part of the substrate and/or the exposed portion of the trench fill structure,
wherein the trench fill structure comprises a high-k dielectric layer, the high-k dielectric layer being sandwiched between a side wall of a fill material and the substrate.

9. The semiconductor device of claim 8, wherein the buffer dielectric layer comprises a first buffer dielectric layer, a second buffer dielectric layer and a third buffer dielectric layer.

10. The semiconductor device of claim 8, wherein the trench fill structure comprises a first conductive metal layer, and wherein the exposure of at least a top portion of the trench fill structure in the first opening comprises: exposure of the first conductive metal layer at a top side wall portion of the trench fill structure in the first opening that is so formed as to surround the top side wall portion of the trench fill structure; and/or exposure of part or the entirety of a top surface of the first conductive metal layer in the trench fill structure in the first opening that resides on a top surface of the trench fill structure.

11. The semiconductor device of claim 8, wherein a metal interconnection is formed in the pad region of the substrate, and wherein the plug structure comprises: a third isolating oxide layer on a side wall of a through hole in which a top surface of the metal interconnection is partially exposed; and a second conductive metal layer, which fills up the through hole and is electrically connected at the bottom to the metal interconnection.

12. The semiconductor device of claim 8, wherein a pad structure is also formed on the buffer dielectric layer in the pad region so as to fill up the second opening and be electrically connected to the exposed top portion of the plug structure.

13. A semiconductor device, comprising:
a substrate with a pixel region, the substrate comprising a trench formed in the pixel region;
a trench fill structure formed in the pixel region of the substrate;
a buffer dielectric layer covering the surface of the substrate in the pixel region, the buffer dielectric layer comprising a first opening, which exposes at least part of the substrate around a top side wall portion of the trench fill structure, or exposes both of at least part of the substrate around a top side wall portion of the trench fill structure and at least a top portion of the trench fill structure; and
a metal grid layer formed on the buffer dielectric layer so as to fill the first opening and be electrically connected to the exposed part of the substrate, or the metal grid layer being electrically connected to both of the exposed part of the substrate and the exposed portion of the trench fill structure,
wherein the trench fill structure comprises a high-k dielectric layer, the high-k dielectric layer being sandwiched between a side wall of a fill material and the substrate.

14. The semiconductor device of claim 13, wherein the trench fill structure comprises a first isolating oxide layer, the high-k dielectric layer, a second isolating oxide layer, which are sequentially stacked over a surface of a trench in the substrate, and the fill material filled in the trench, the first isolating oxide layer, the high-k dielectric layer and the second isolating oxide layer being situated at least between the side wall of the fill material and the substrate.

15. The semiconductor device of claim 13, wherein the substrate further has a pad region peripheral to the pixel region, and wherein a metal interconnection is formed in the pad region of the substrate and a plug structure above the metal interconnection, the plug structure being electrically connected at the bottom to the metal interconnection.

16. The semiconductor device of claim 15, wherein a through hole is formed in the pad region of the substrate, the through hole exposing at least part of a top surface of the metal interconnection, and wherein the plug structure comprises a third isolating oxide layer on a side wall of the through hole and a third conductive metal layer which fills up the through hole; and/or
wherein the buffer dielectric layer further covers the surface of the substrate in the pad region and comprises a second opening exposing at least a top portion of the plug structure, and wherein a pad structure is formed on the buffer dielectric layer in the pad region so as to fill up the second opening and be electrically connected to the exposed top portion of the plug structure.

17. The semiconductor device of claim 13, wherein the high-k dielectric layer has a k value of greater than 7.

18. The semiconductor device of claim 13, wherein the trench fill structure comprises a first conductive metal layer, and wherein the exposure of at least a top portion of the trench fill structure in the first opening comprises: exposure of the first conductive metal layer at a top side wall portion of the trench fill structure in the first opening that is so formed as to surround the top side wall portion of the trench fill structure; and/or exposure of part or the entirety of a top surface of the first conductive metal layer in the trench fill structure in the first opening that resides on a top surface of the trench fill structure.

* * * * *